(12) United States Patent
Tani

(10) Patent No.: US 11,777,473 B2
(45) Date of Patent: Oct. 3, 2023

(54) MULTIPLEXER, HIGH-FREQUENCY FRONT-END CIRCUIT, AND COMMUNICATION DEVICE

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 632 days.

(21) Appl. No.: 17/009,933

(22) Filed: Sep. 2, 2020

(65) Prior Publication Data

US 2020/0403604 A1 Dec. 24, 2020

Related U.S. Application Data

(63) Continuation of application No. PCT/JP2019/007482, filed on Feb. 27, 2019.

(30) Foreign Application Priority Data

Mar. 8, 2018 (JP) .................................. 2018-042027

(51) Int. Cl.
*H04B 7/00* (2006.01)
*H03H 9/72* (2006.01)
(Continued)

(52) U.S. Cl.
CPC ................. *H03H 9/72* (2013.01); *H03F 3/19* (2013.01); *H03H 9/02559* (2013.01);
(Continued)

(58) Field of Classification Search
CPC ............ H03H 9/25; H03H 9/64; H04B 1/0057
See application file for complete search history.

(56) References Cited

U.S. PATENT DOCUMENTS

| 2004/0155730 A1 | 8/2004 | Iwamoto et al. |
| 2010/0150075 A1 | 6/2010 | Inoue et al. |
| (Continued) | | |

FOREIGN PATENT DOCUMENTS

| JP | 2003-249842 A | 9/2003 |
| JP | 2006-157174 A | 6/2006 |
| (Continued) | | |

OTHER PUBLICATIONS

International Search Report for PCT/JP2019/007482 dated May 14, 2019.
Written Opinion for PCT/JP2019/007482 dated May 14, 2019.

*Primary Examiner* — Shantell L Heiber
(74) *Attorney, Agent, or Firm* — Pearne & Gordon LLP

(57) ABSTRACT

Filters 10 and 20 having respective pass bands different from each other, a common terminal to which a terminal 11 of the filter 10 and a terminal of the filter 20 are connected, and an inductor of which one end is connected to the terminal 11 and another end is connected to the common terminal. The filter 10 includes a longitudinally coupled resonator formed of a resonator 132 and resonators 131 and 133 disposed on both sides of the resonator 132, in which the resonator 132 is connected to the terminal 11, and a parallel resonator of which one end is connected to the resonator 132 and another end is connected to a ground electrode, and the resonator 132 and the parallel resonator of the resonators included in the filter 10 are connected to a signal path between the resonator 132 and the terminal 11.

17 Claims, 20 Drawing Sheets

(51) Int. Cl.
  *H03F 3/19* (2006.01)
  *H03H 9/02* (2006.01)
  *H03H 9/145* (2006.01)
  *H03H 9/25* (2006.01)
  *H03H 9/64* (2006.01)
  *H04B 1/00* (2006.01)

(52) U.S. Cl.
  CPC .............. *H03H 9/145* (2013.01); *H03H 9/25* (2013.01); *H03H 9/64* (2013.01); *H04B 1/0057* (2013.01); *H03F 2200/451* (2013.01)

(56) References Cited

U.S. PATENT DOCUMENTS

| | | |
|---|---|---|
| 2012/0235767 A1 | 9/2012 | Takata et al. |
| 2012/0300679 A1 | 11/2012 | Tsutsumi |
| 2015/0220665 A1* | 8/2015 | Turner .................... G06F 30/36 716/103 |
| 2016/0028366 A1 | 1/2016 | Takamine |
| 2016/0173062 A1 | 6/2016 | Takamine |
| 2017/0331457 A1* | 11/2017 | Satoh ...................... H10N 30/40 |
| 2018/0041194 A1* | 2/2018 | Ito ........................ H03H 9/6483 |
| 2018/0109243 A1 | 4/2018 | Takamine |
| 2018/0159507 A1* | 6/2018 | Goto ......................... H03H 9/25 |
| 2018/0226952 A1* | 8/2018 | Tanaka ..................... H03H 9/72 |
| 2019/0149121 A1 | 5/2019 | Tani |

FOREIGN PATENT DOCUMENTS

| | | |
|---|---|---|
| JP | 2012-244615 A | 12/2012 |
| JP | 2017-225109 A | 12/2017 |
| WO | 2009/025106 A1 | 2/2009 |
| WO | 2011/077773 A1 | 6/2011 |
| WO | 2014/167752 A1 | 10/2014 |
| WO | 2015/040922 A1 | 3/2015 |
| WO | 2016/208670 A1 | 12/2016 |
| WO | 2018/012275 A1 | 1/2018 |

* cited by examiner

FIG. 1
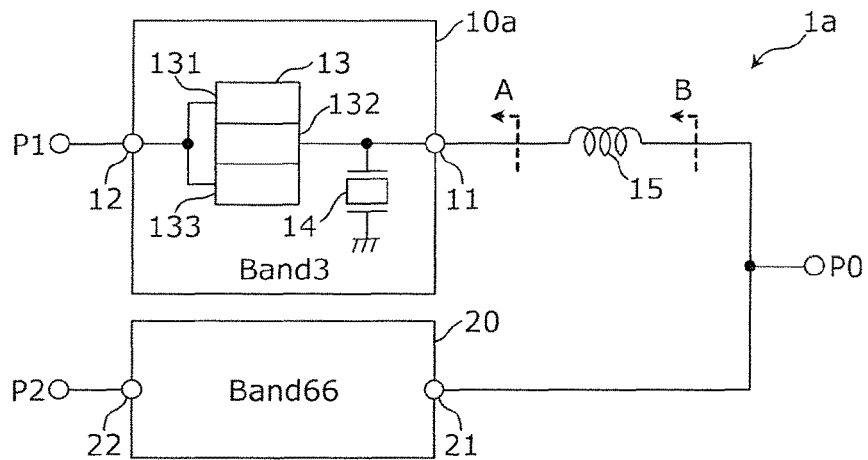
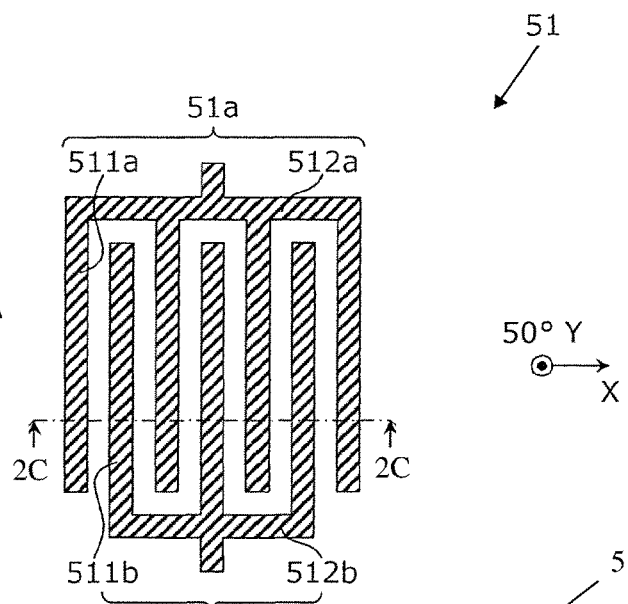
FIG. 2A
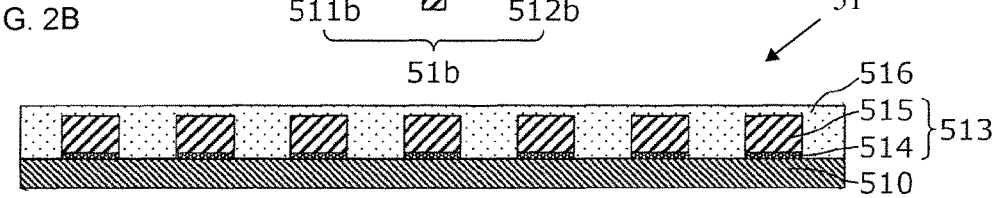
FIG. 2B
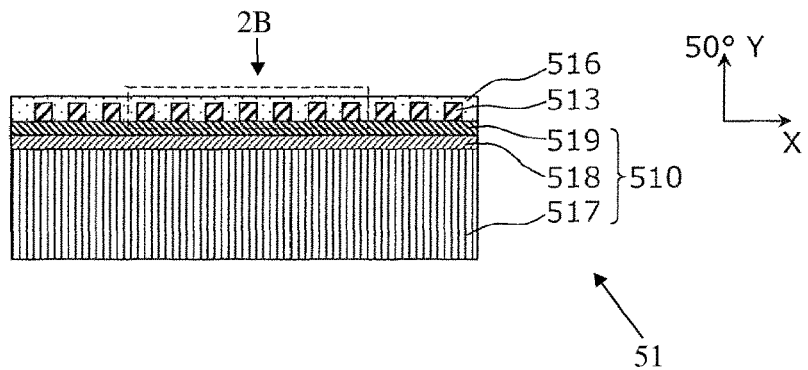
FIG. 2C

MULTIPLEXER, HIGH-FREQUENCY FRONT-END CIRCUIT, AND COMMUNICATION DEVICE

This is a continuation of International Application No. PCT/JP2019/007482 filed on Feb. 27, 2019 which claims priority from Japanese Patent Application No. 2018-042027 filed on Mar. 8, 2018. The contents of these applications are incorporated herein by reference in their entireties.

BACKGROUND

The present disclosure relates to a multiplexer, a high-frequency front-end circuit, and a communication device.

International Publication No. 2011/077773 discloses, as a multiplexer in which one terminal of each of a plurality of filters is connected to a common terminal, a multiplexer provided with a receiver-side filter portion having a longitudinally coupled resonator. Further, in recent years, there has been a demand for a multiplexer supporting carrier aggregation for communication by simultaneously using a plurality of frequency bands.

In such a multiplexer supporting a plurality of bands, to suppress insertion loss in a frequency band of each band, for each filter in a plurality of filters viewed from a common terminal, it is required to, while achieving impedance matching for a pass band of the relevant filter, increase impedance of a pass band of another filter in the relevant filter.

To meet the requirement, a configuration in which phase adjustment is performed by a so-called series inductor provided between one filter and a common terminal is conceivable. However, when a series inductor having a large inductance value is provided, insertion loss increases.

BRIEF SUMMARY

The present disclosure provides a multiplexer that includes a longitudinally coupled resonator, and adjusts a phase by a series inductor, and for which insertion loss is small.

A multiplexer according to an aspect of the present disclosure includes a first filter and a second filter having respective pass bands different from each other, a common terminal to which a first terminal of the first filter and a second terminal of the second filter are connected, and an inductor of which one end is connected to the first terminal and another end is connected to the common terminal. The first filter includes a longitudinally coupled resonator formed of one or more first resonators and a plurality of second resonators disposed on both sides of each of the first resonators, in which the one or more first resonators are connected to the first terminal, and a third resonator of which one end is connected to the one or more first resonators and another end is connected to a ground electrode, and the one or more first resonators and the third resonator of resonators included in the first filter are connected to a signal path between the longitudinally coupled resonator and the first terminal.

According to the above configuration, impedance of the first filter that is shifted to be inductive by the inductor, and capacitive impedance of the second filter are combined at the common terminal. This makes it easy to design such that impedance of an entirety of the multiplexer viewed from the common terminal approaches reference impedance, for example, about 50Ω, and makes it easier to achieve more accurate impedance matching. Note that, the reference impedance is impedance serving as a reference for a transmission system in which the multiplexer is provided, and is not limited to about 50Ω, and may be about 75Ω, or the like.

In this case, there is a requirement for reducing inductance of the inductor to reduce insertion loss as described above. In this regard, in the above configuration, impedance of the longitudinally coupled resonator is capacitive particularly in the pass band of the second filter, and the impedance is first shifted on a Smith chart clockwise to a short side along a constant conductance circle by the third resonator, and then shifted clockwise to be inductive along a constant resistance circle by the inductor. Thus, a smaller inductance value suffices for the inductor required to shift the impedance in the pass band of the second filter of the longitudinally coupled resonator to be inductive, compared to a case where the third resonator is not included. As a result, a multiplexer having small insertion loss is obtained.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 1 is a circuit diagram illustrating an example of a configuration of a multiplexer according to a first embodiment;

FIGS. 2A to 2C are a plan view and sectional views schematically illustrating an example of structure of a surface acoustic wave resonator according to the first embodiment;

DETAILED DESCRIPTION

Figure 3:
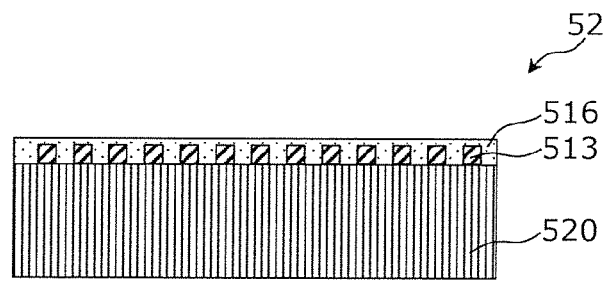
FIG. 3 is a sectional view schematically illustrating an example of structure of a surface acoustic wave resonator according to a modification example of the first embodiment.

Hereinafter, embodiments of the present disclosure will be described in detail with reference to the embodiments and the drawings. Note that, any of the embodiments to be described below represents a comprehensive or specific example. Numerical values, shapes, materials, constituent elements, arrangement and connection forms of the constituent elements, and the like illustrated in the following embodiments are mere examples and are not intended to limit the present disclosure.

Note that, in a description of a circuit configuration in the present specification, words "being connected" refer to any state of being electrically connected, and, for example, a case of being connected via one or more circuit elements from among a simple wiring conductor, an inductor, and a capacitor, is included. Further, words "directly connected" only refer to a state of being connected by a simple wiring conductor, and a case of being connected via an inductor or a capacitor is not included.

First Embodiment

In a first embodiment, a multiplexer that includes a longitudinally coupled resonator, and adjusts a phase by a series inductor will be described, by illustrating an example of a multiplexer including two filters having respective pass bands different from each other.

FIG. 1 is a circuit diagram illustrating an example of a configuration of the multiplexer according to the first embodiment. As illustrated in FIG. 1, a multiplexer 1a includes a common terminal P0, individual terminals P1 and P2, filters 10a and 20, and an inductor 15.

The filter 10a is a band pass filter having a first frequency band as a pass band. An unlimited example of the first frequency band is a downlink frequency band of 1805 MHz to 1880 MHz in Band3 defined in Third Generation Partnership Project (3GPP). Here, the notation of 1805 MHz to 1880 MHz represents a frequency range of 1805 MHz or more and 1880 MHz or less. In the present specification, a frequency range will be described by similar notation.

The filter 10a includes terminals 11 and 12, a longitudinally coupled resonator 13, and a parallel resonator 14. The terminal 11 is connected to one end of the inductor 15, and another end of the inductor 15 is connected to the common terminal P0. The terminal 12 is connected to the individual terminal P1.

The longitudinally coupled resonator 13 is formed of a resonator 132 and resonators 131 and 133 disposed on both sides of the resonator 132. One end of the resonator 132 is connected to the terminal 11, and one end of each of the resonators 131 and 133 is connected to the terminal 12. Another end of each of the resonators 131, 132, and 133 is connected to a ground electrode (not illustrated).

The parallel resonator 14 is formed of a single resonator, a plurality of resonators connected in parallel, or a plurality of resonators connected in series. One end of the parallel resonator 14 is connected to the resonator 132, and another end is connected to a ground electrode. The one end of the parallel resonator 14 may be directly connected to the resonator 132.

The filter 10a may further include another resonator (not illustrated). The other resonator may include at least one of a series resonator forming a signal path between the terminals 11 and 12, a parallel resonator connected between the signal path between the terminals 11 and 12, and a ground electrode, and the resonator forming the longitudinally coupled resonator. However, the resonator 132 and the parallel resonator 14 of the resonators included in the first filter 10a are connected to a signal path between the resonator 132 and the terminal 11.

The filter 20 is a band pass filter having a second frequency band as a pass band. An unlimited example of the second frequency band is a downlink frequency band of 2110 MHz to 2200 MHz in Band66 defined in 3GPP.

The filter 20 has terminals 21 and 22. The terminal 21 is connected to the common terminal P0. The terminal 22 is connected to the individual terminal P2. The configuration of the filter 20 is not particularly limited, but, for example, the filter 20 may be a ladder-type filter formed of one or more series resonators forming a signal path between the terminals 21 and 22, and one or more parallel resonators connected between the signal path between the terminals 21 and 22, and a ground electrode. Further, a longitudinally-coupled type filter having a longitudinally coupled resonator may be employed.

In the multiplexer 1a formed as described above, the filters 10a and 20 are an example of a first filter and an example of a second filter, respectively. The terminals 12 and 22 are an example of a first terminal and an example of a second terminal, respectively. The resonator 132 is an example of a first resonator, each of the resonators 131 and 133 is an example of a second resonator, and the parallel resonator 14 is an example of a third resonator.

Each of the filters 10a and 20 may be a surface acoustic wave filter, and in this case, each of the resonators (including the resonators 131, 132, 133 and the parallel resonator 14) included in the filters 10a and 20 may be formed of a surface acoustic wave resonator.

FIGS. 2A to 2C are diagrams schematically illustrating an example of structure of a surface acoustic wave resonator. FIG. 2A is a plan view, and each of FIGS. 2B and 2C is a sectional view taken along a dashed-dotted line illustrated in FIG. 2A and viewed in an arrow direction. FIG. 2B is an enlarged view of a portion of the resonator 51 surrounded by the dotted line in FIG. 2C. A resonator 51 illustrated in FIGS. 2A to 2C describes typical structure of a surface acoustic wave resonator, and when various parameters including the number and lengths of electrode fingers forming an electrode are appropriately set, the resonator 51 is applied to any resonator included in the acoustic wave filters 10a and 20.

The resonator 51 is formed of a piezoelectric substrate 510, and comb-shaped electrodes 51a and 51b.

As illustrated in FIGS. 2A and 2B, a pair of the comb-shaped electrodes 51a and 51b facing each other is formed on the piezoelectric substrate 510.

The comb-shaped electrode 51a is formed of a plurality of electrode fingers 511a parallel to one another and a busbar electrode 512a connecting the plurality of electrode fingers 511a. The comb-shaped electrode 51b is formed of a plurality of electrode fingers 511b parallel to one another and a busbar electrode 512b connecting the plurality of electrode fingers 511b. The plurality of electrode fingers 511a and 511b is formed along a direction orthogonal to an X-axis direction.

The comb-shaped electrodes 51a and 51b are collectively referred to as an interdigital transducer (IDT) electrode 513.

As illustrated in FIG. 2B, the IDT electrode 513 has structure in which an adhesion layer 514 and a main electrode layer 515 are laminated.

The adhesion layer 514 is a layer for improving adhesion between the piezoelectric substrate 510 and the main electrode layer 515, and for example, Ti is used as a material. The adhesion layer 514 has a film thickness of, for example, about 12 nm.

As a material for the main electrode layer 515, for example, Al containing about 1% of Cu is used. A film thickness of the main electrode layer 515 is, for example, about 162 nm.

A protective layer 516 is formed so as to cover the comb-shaped electrodes 51a and 51b. The protective layer 516 is a layer intended to protect the main electrode layer 515 from an external environment, to adjust frequency temperature characteristics, and to increase moisture resistance, and is, for example, a dielectric film containing silicon dioxide as a main component. A thickness of the protective layer 516 is, for example, about 250 nm.

Note that, the respective materials forming the adhesion layer 514, the main electrode layer 515, and the protective layer 516 are not limited to the materials described above. Further, the IDT electrode 513 may not have the laminated structure described above. The IDT electrode 513 may be formed of, for example, metal, such as Ti, Al, Cu, Pt, Au, Ag, or Pd, or alloy, or may be formed of a plurality of laminated bodies formed of the metal or alloy described above. Further, the protective layer 516 may not be formed.

Next, laminated structure of the piezoelectric substrate 510 will be described.

As illustrated in FIG. 2C, the piezoelectric substrate 510 includes a high acoustic velocity support substrate 517, a low acoustic velocity film 518, and a piezoelectric film 519, and has structure in which the high acoustic velocity support substrate 517, the low acoustic velocity film 518, and the piezoelectric film 519 are laminated in this order.

The piezoelectric film 519 is formed of a 50° Y-cut X-propagation LiTaO$_3$ piezoelectric single crystal or piezoelectric ceramics. That is, the piezoelectric film 519 is a lithium tantalate single crystal cut along a plane having an axis that is rotated about an X-axis by about 50° from a Y-axis as a normal line or ceramics, and is formed of a single crystal or ceramics in which a surface acoustic wave propagates in the X-axis direction. The piezoelectric film 519 has, for example, a thickness of about 600 nm. Note that, depending on required specifications for each of the filters, a material, cut-angles, and a thickness of the piezoelectric single crystal used for the piezoelectric film 519 are appropriately selected.

The high acoustic velocity support substrate 517 is a substrate that supports the low acoustic velocity film 518, the piezoelectric film 519, and the IDT electrode 513. The high acoustic velocity support substrate 517 is, additionally, a substrate in which acoustic velocity of a bulk wave in the high acoustic velocity support substrate 517 is higher than that of an acoustic wave, such as a surface acoustic wave or a boundary wave propagating through the piezoelectric film 519, and functions to confine a surface acoustic wave to a part where the piezoelectric film 519 and the low acoustic velocity film 518 are laminated, and to suppress the surface acoustic wave from leaking to the high acoustic velocity support substrate 517. The high acoustic velocity support substrate 517 is, for example, a silicon substrate, and has a thickness of, for example, about 200 µm.

The low acoustic velocity film 518 is a film in which acoustic velocity of a bulk wave in the low acoustic velocity film 518 is lower than that of a bulk wave propagating through the piezoelectric film 519, and is disposed between the piezoelectric film 519 and the high acoustic velocity support substrate 517. Due to this structure and a property that energy of an acoustic wave essentially concentrates in a medium in which acoustic velocity is low, leakage of energy of a surface acoustic wave outside the IDT electrode 513 is suppressed. The low acoustic velocity film 518 is, for example, a film containing silicon dioxide as a main component, and has a thickness of, for example, about 670 nm.

Note that, according to the laminated structure described above of the piezoelectric substrate 510, a Q-value at each of a resonant frequency and an anti-resonant frequency can be significantly increased, as compared with structure in the related art in which a piezoelectric substrate is used as a single layer. That is, since an acoustic wave resonator having a high Q value can be formed, it is possible to form a filter having small insertion loss by using the acoustic wave resonator.

Note that, the high acoustic velocity support substrate 517 may have structure in which a support substrate and a high acoustic velocity film are laminated. A high acoustic velocity film refers to a film in which acoustic velocity of a bulk wave propagating therethrough is higher than an acoustic wave, such as a surface acoustic wave or a boundary wave propagating through the piezoelectric film 519.

In this case, for a support substrate, a piezoelectric body, such as lithium tantalate, lithium niobate, or quartz, various ceramics, such as alumina, magnesia, silicon nitride, aluminum nitride, silicon carbide, zirconia, cordierite, mullite, steatite, and forsterite, a dielectric material, such as glass or sapphire, or a semiconductor, such as silicon or gallium nitride, and a resin substrate, and the like, can be used.

Additionally, for a high acoustic velocity film, various high acoustic velocity materials can be used, such as aluminum nitride, aluminum oxide, silicon carbide, silicon nitride, silicon oxynitride, a DLC film, or diamond, a medium containing the above-mentioned material as a main component, a medium containing a mixture of the above materials as a main component, and the like.

The surface acoustic wave resonator 51 in which the IDT electrode 513 is formed on the piezoelectric substrate 510 having the laminated structure has been illustrated, but the structure of the surface acoustic wave resonator is not limited to this example.

FIG. 3 is a sectional view schematically illustrating an example of structure of a surface acoustic wave resonator according to a modification example of the first embodiment. As illustrated in FIG. 3, a resonator 52 is formed of a piezoelectric single crystal substrate 520 formed of a single layer of a piezoelectric body, the IDT electrode 513 formed on the piezoelectric single crystal substrate 520, and the protective layer 516 formed on the piezoelectric single crystal substrate 520 and on the IDT electrode 513.

The piezoelectric single crystal substrate 520 is formed of, for example, a piezoelectric single crystal of $LiNbO_3$. As with the piezoelectric film 519, for the piezoelectric single crystal substrate 520 as well, a material, cut-angles, and a thickness of the piezoelectric single crystal are appropriately selected according to required specifications for respective filters.

Hereinafter, a characteristic configuration and effects of a multiplexer as an example will be described, in comparison with a multiplexer assumed as a comparative example.

Figure 4:
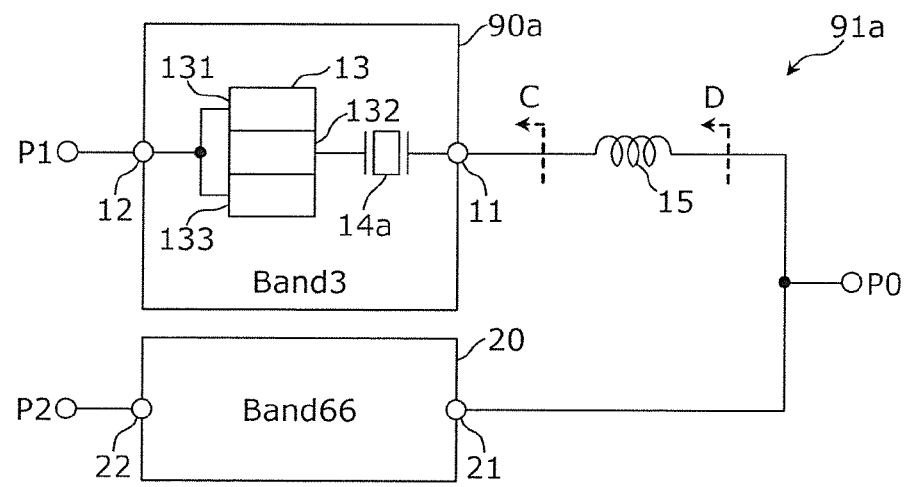
FIG. 4 is a circuit diagram illustrating an example of a configuration of a multiplexer according to a comparative example of the first embodiment.

FIG. 4 is a circuit diagram illustrating an example of a configuration of a multiplexer 91a according to a comparative example of the first embodiment. The multiplexer 91a is different from the multiplexer 1a in FIG. 1 in that the parallel resonator 14 is replaced with a series resonator 14a in a filter 90a. One end of the series resonator 14a is connected to the resonator 132, and another end is connected to the terminal 11. Other than the difference in the filter 90a, the multiplexer 91a is the same as the multiplexer 1a.

Figure 5:
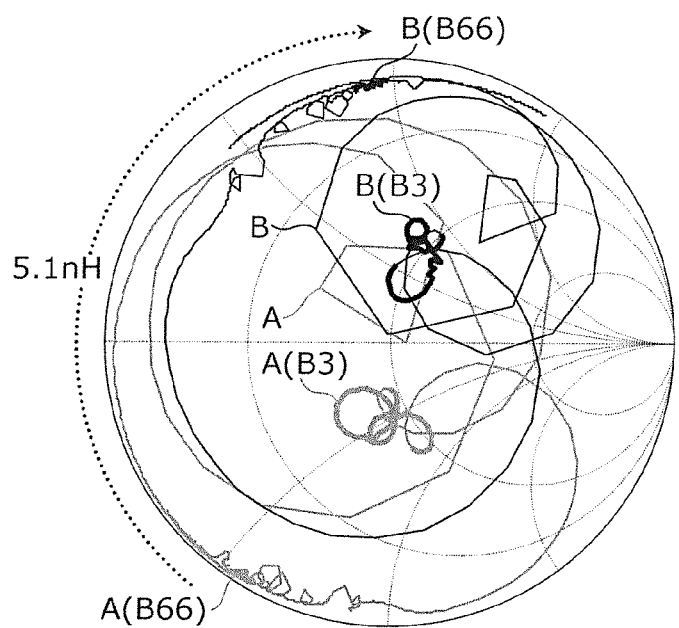
FIG. 5 is a Smith chart showing an example of impedance of a main part of the multiplexer according to the first embodiment.

FIG. 5 is a Smith chart showing an example of impedance of a main part of the multiplexer 1a. In FIG. 5, impedance A illustrated in gray is impedance when the filter 10a is viewed from a point A of the multiplexer 1a. Parts A(B3) and A(B66) of the impedance A, each indicated by a bold line indicate a part corresponding to a first frequency band (downlink frequency band in Band3) and a part corresponding to a second frequency band (frequency band in Band66) of the impedance A, respectively.

Additionally, impedance B indicated in black is impedance when the inductor 15 is viewed from a point B of the multiplexer 1a. Parts B(B3) and B(B66) of the impedance B, each indicated by a bold line indicate a part corresponding to a first frequency band (downlink frequency band in Band3) and a part corresponding to a second frequency band (frequency band in Band66) of the impedance B, respectively.

Figure 6:
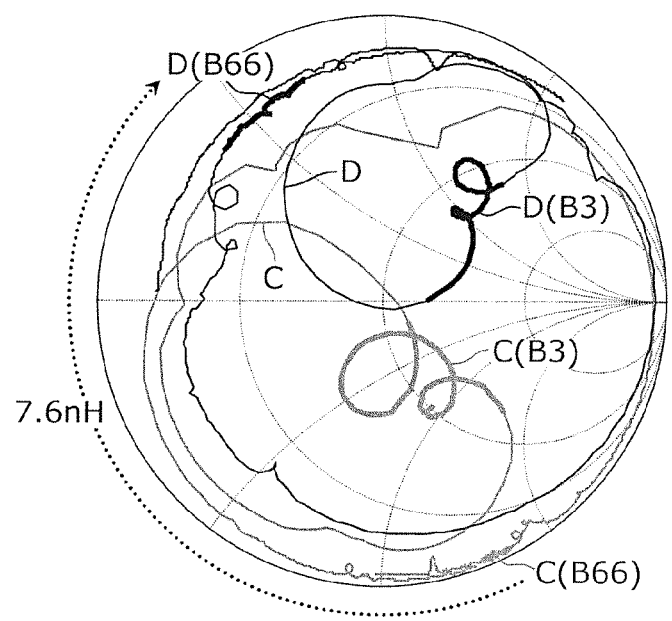
FIG. 6 is a Smith chart showing an example of impedance of a main part of the multiplexer according to the comparative example of the first embodiment.

FIG. 6 is a Smith chart showing an example of impedance of a main part of the multiplexer 91a. In FIG. 6 as well, according to notation similar to that in FIG. 5, impedance C when the filter 90a is viewed from a point C of the multiplexer 91a, and impedance D when the inductor 15 is viewed from a point D of the multiplexer 91a are shown.

In the multiplexer 1a, the impedances B is located at an inductive position, and in the multiplexer 91a, the impedance D is located at an inductive position. Accordingly, when the impedance B and capacitive impedance (not illustrated) of the filter 20 are combined, impedance of an entirety of the multiplexer 1a approaches, for example, reference impedance of about 50Ω, or the like, and when the impedance D and the capacitive impedance (not illustrated) of the filter 20 are combined, impedance of an entirety of the multiplexer 91a approaches, for example, the reference impedance of about 50Ω, or the like. Here, the reference impedance is impedance serving as a reference for a transmission system in which the multiplexer 1a or 91a is provided, and is not limited to about 50Ω, and may be about 75Ω, or the like.

As shown in FIG. 5, in the multiplexer 1a, impedance (not illustrated) when the longitudinally coupled resonator 13 is viewed from the resonator 132 is rotated clockwise along a constant conductance circle by the parallel resonator 14 on the Smith chart, to be the impedance A. A part (not illustrated) corresponding to a second frequency band of impedance of the longitudinally coupled resonator 13 shifts to a part A(B66) of the impedance A.

The impedance A rotates clockwise along a constant resistance circle on the Smith chart by the inductor 15, to be the impedance B. The part A(B66) corresponding to the second frequency band of the impedance A shifts to the part B(B66) of the impedance B. An inductance value of the inductor 15 for shifting the impedance A to the impedance B is about 5.1 nH, for example.

As shown in FIG. 6, in the multiplexer 91a as well, similar phase adjustment is performed. In the multiplexer 91a, an inductance value of the inductor 15 for shifting the impedance C to the impedance D is about 7.6 nH, for example.

From comparison of FIG. 5 with FIG. 6, it can be seen that, in the example, a smaller inductance value suffices for the inductor 15, compared to that in the comparative example.

Next, a description will be given of a reduction effect of insertion loss due to a small inductance value of the inductor 15.

Figure 7:
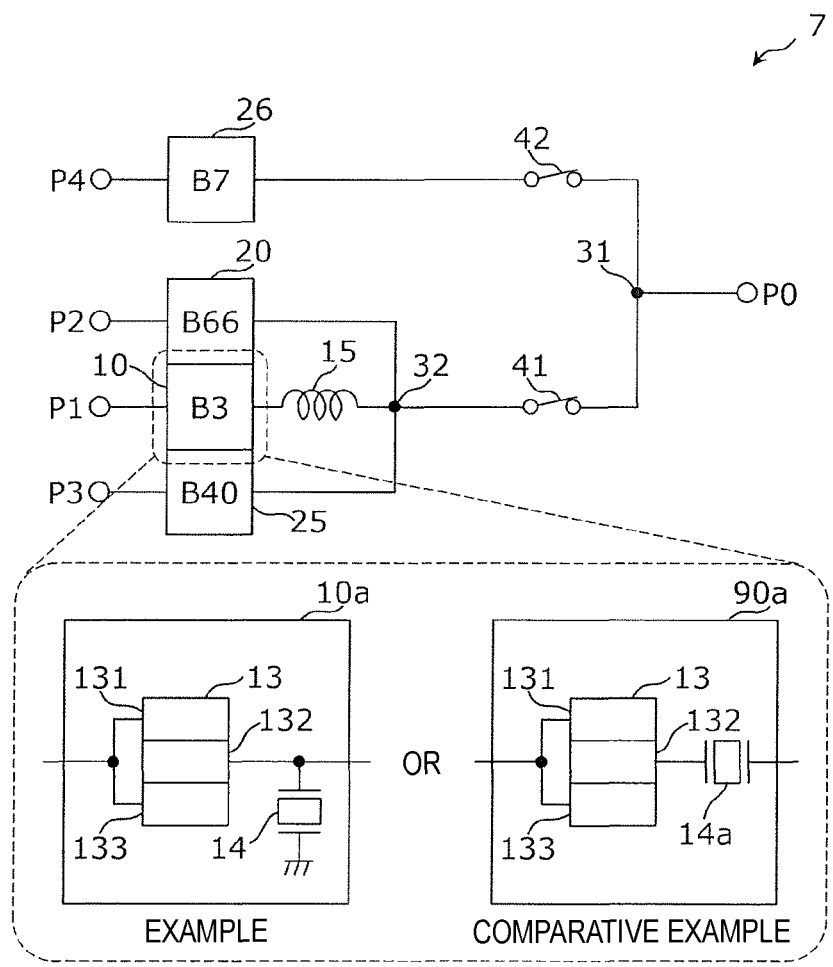
FIG. 7 is a circuit diagram illustrating an example of a configuration of a quadplexer according to the first embodiment.

FIG. 7 is a circuit diagram illustrating an example of a configuration of a quadplexer used to check the reduction effect of insertion loss. As illustrated in FIG. 7, a quadplexer 7 includes the filter 20, filters 10, 25, 26, the inductor 15, and switches 41 and 42.

One end of each of the filters 10, 20, and 25 is connected to a connection point 32. The one end of the filter 10 and the connection point 32 are connected to each other via the inductor 15. The connection point 32 is connected to a connection point 31 via the switch 41, and one end of the filter 26 is connected to the connection point 31 via the switch 42. The connection point 31 is connected to the common terminal P0, and respective another ends of the filters 10, 20, 25, and 26 are connected to the individual terminals P1, P2, individual terminals P3, and P4, respectively.

The filter 10 is a band pass filter having a first frequency band as a pass band. An unlimited example of the first frequency band is a downlink frequency band of 1805 MHz to 1880 MHz of Band3 defined in 3GPP.

The filter 20 is the band pass filter having the second frequency band as the pass band. An unlimited example of the second frequency band is a downlink frequency band of 2110 MHz to 2200 MHz of Band66 defined in 3GPP.

The filter 25 is a band pass filter having a third frequency band as a pass band. An unlimited example of the third frequency band is a frequency band of 2300 MHz to 2400 MHz of Band40 defined in 3GPP.

The filter 26 is a band pass filter having a fourth frequency band as a pass band. An unlimited example of the fourth frequency band is a downlink frequency band of 2620 MHz to 2690 MHz of Band7 defined in 3GPP.

The quadplexer 7 brings both the switches 41 and 42 into a conductive state to adapt to carrier aggregation using four communication bands simultaneously.

A case where the filter 10 of the quadplexer 7 is replaced with the filter 10a in FIG. 1 is taken as an example, and a case where the filter 10 is replaced with the filter 90a in FIG. 4 is taken as a comparative example, and comparison was performed for insertion loss between each of the individual terminals P1 to P4 and the common terminal P0 between the example and the comparative example.

Figure 8A:
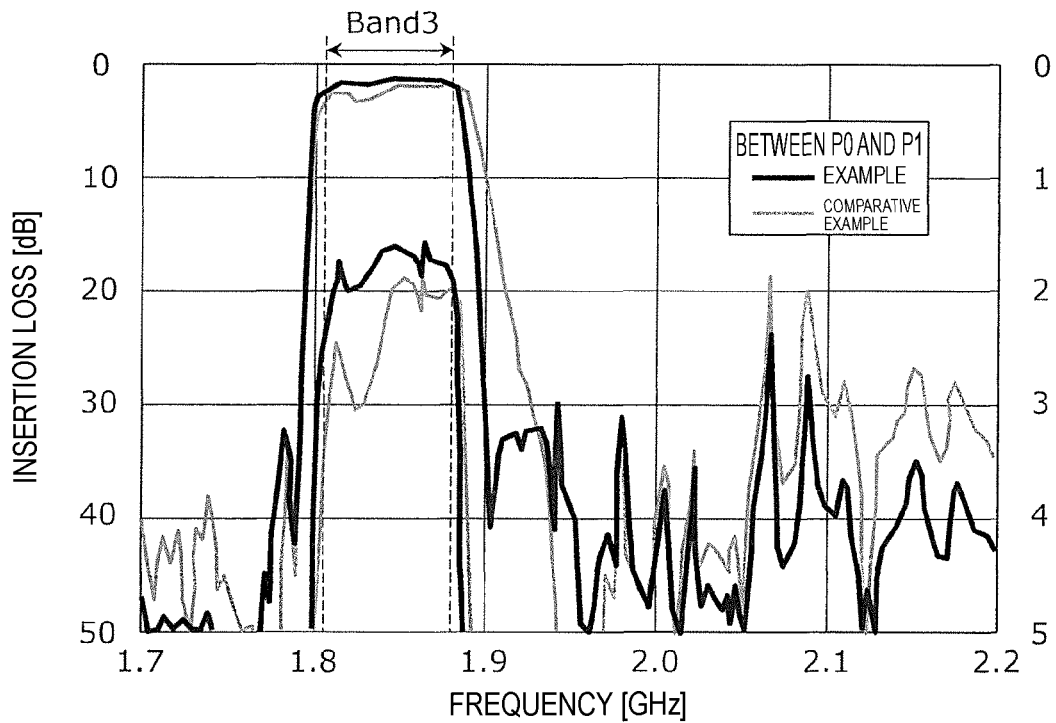
FIG. 8A is a graph showing an example of insertion loss of the quadplexer according to the first embodiment.
Figure 8B:
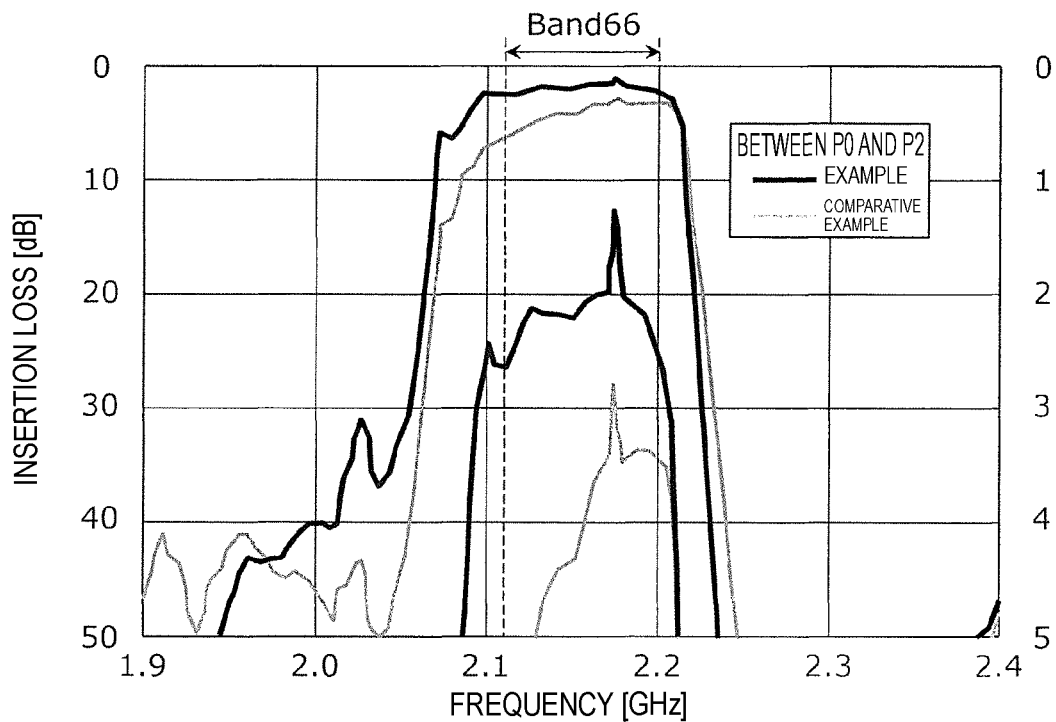
FIG. 8B is a graph showing an example of the insertion loss of the quadplexer according to the first embodiment.
Figure 8C:
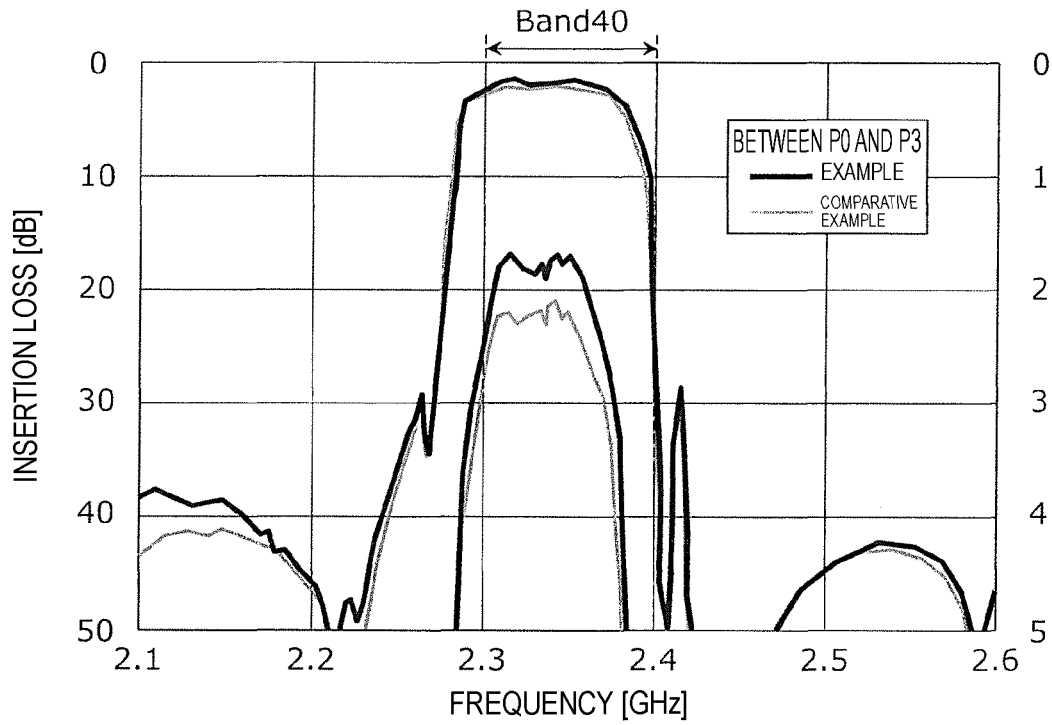
FIG. 8C is a graph showing an example of the insertion loss of the quadplexer according to the first embodiment.
Figure 8D:
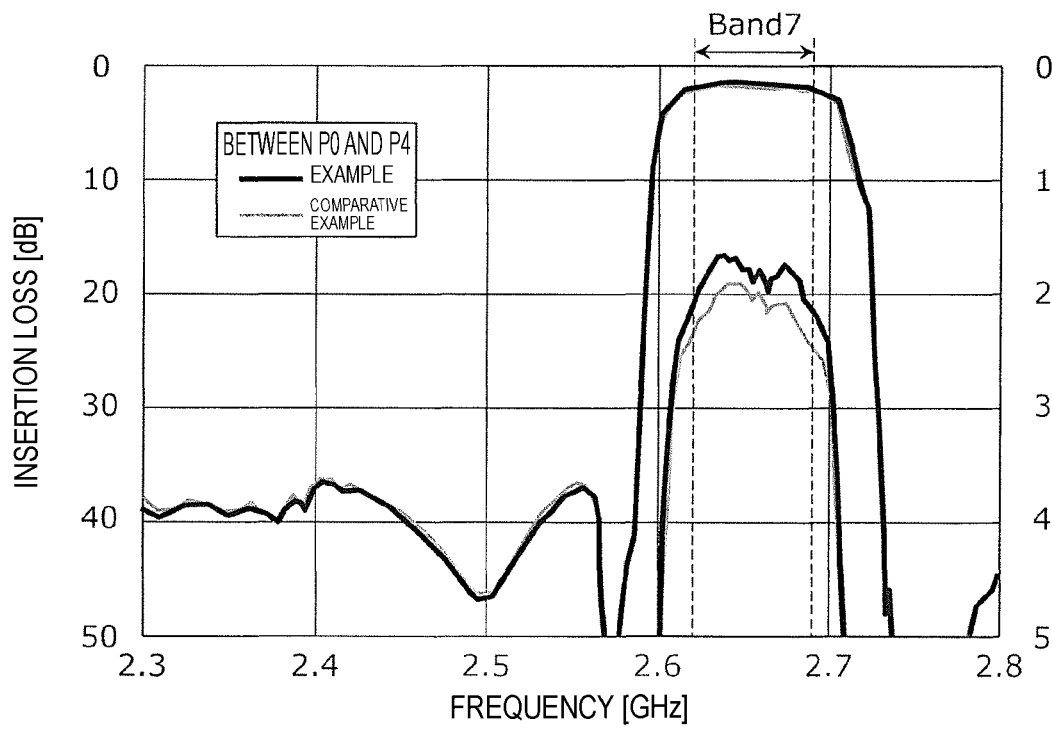
FIG. 8D is a graph showing an example of the insertion loss of the quadplexer according to the first embodiment.

FIG. 8A is a graph showing an example of insertion loss in a signal path between the individual terminal P1 of the quadplexer 7 and the common terminal P0, FIG. 8B is a graph showing an example of insertion loss in a signal path between the individual terminal P2 of the quadplexer 7 and the common terminal P0, FIG. 8C is a graph showing an example of insertion loss in a signal path between the individual terminals P3 of the quadplexer 7 and the common terminal P0, and FIG. 8D is a graph showing an example of insertion loss in a signal path between the individual terminals P4 of the quadplexer 7 and the common terminal P0. In each of FIG. 8A to FIG. 8D, insertion loss in a pass band is enlarged and shown in accordance with a scale on a right side of the graph.

From FIG. 8A, it can be seen that insertion loss in Band3 is smaller in the example than in the comparative example. This is considered to be due to a fact that, in the filter 10a, the inductance value of the inductor 15 decreases, compared to the filter 90a.

From FIG. 8B, it can be seen that insertion loss in Band66 is smaller in the example than in the comparative example. This is, as can be seen in FIG. 5 and FIG. 6, considered to be due to a fact that the part B(B66) of the impedance B is located closer to an open side and to an outer periphery, than a part D(B66) of the impedance D. That is, when the inductor 15 is viewed from the connection point 32, in the filter 10a, impedance is higher in Band66 than in the filter 90a, and thus it is considered that leakage of a signal in Band66 to the filter 10a is reduced.

From FIG. 8C and FIG. 8D, it can be seen that insertion loss does not increase in Band40 and Band7 as well in the example compared to the comparative example.

As described above, form FIG. 8A to FIG. 8D, it was confirmed that in the example using the filter 10a, the insertion loss decreased compared to the comparative example using the filter 90a.

Next, an effect of connecting the parallel resonator 14 to the resonator 132, out of the resonator 132, the resonators 131, and 133 forming the longitudinally coupled resonator 13 will be described. Note that, a description will be given below by illustrating an example of a general filter 18 for which a pass band is not limited.

Figure 9:
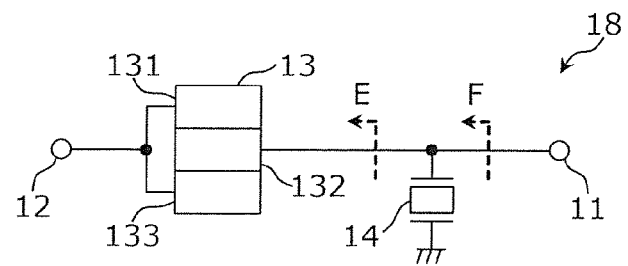
FIG. 9 is a circuit diagram illustrating an example of a configuration of a filter according to the first embodiment.

FIG. 9 is a circuit diagram illustrating an example of a configuration of the filter 18. The filter 18 has the same configuration as that of the filter 10a in FIG. 1 except that a pass band is not limited.

Figure 10:
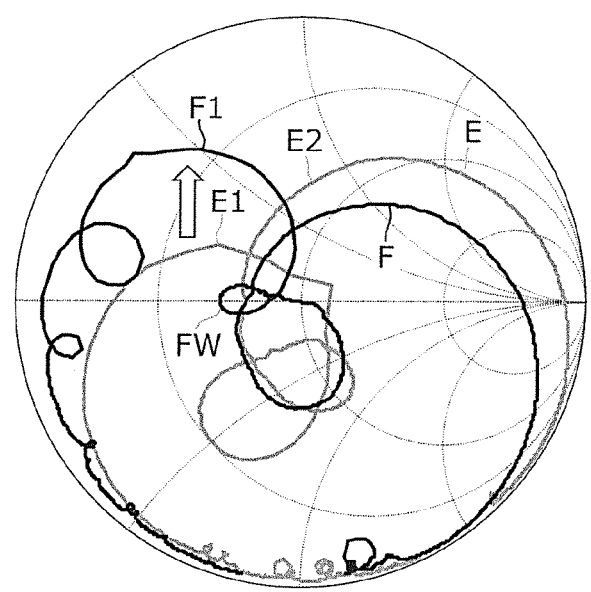
FIG. 10 is a Smith chart showing an example of impedance of a main part of the filter according to the first embodiment.

FIG. 10 is a Smith chart showing an example of impedance of a main part of the filter 18. FIG. 10 shows impedance E when the longitudinally coupled resonator 13 is viewed from a point E, and impedance F when the longitudinally coupled resonator 13 is viewed from a point F. As shown in FIG. 10, the impedance E viewed from the resonator 132 of the longitudinally coupled resonator 13 tends to be more capacitive in a part E1 closer to a lower frequency side than a pass band, compared to a part E2 on a higher frequency side.

Thus, the parallel resonator 14 is connected to the resonator 132. The parallel resonator 14, as a so-called parallel capacitor connected between a signal path and a ground electrode, rotates the impedance E on the Smith chart clockwise along a constant conductance circle, to shift to the impedance F. Of the impedance E, the part E1 on the lower frequency side, that is more capacitive than the part E2 on the higher frequency side, is shifted to a part F1 that is more inductive, of the impedance F (a white arrow).

An anti-resonant frequency of the parallel resonator 14 may be within a pass band of the filter 18. In this case, by LC coupling of inductive impedance that the parallel resonator 14 indicates between a resonant frequency and an anti-resonant frequency, and a capacitive component of the longitudinally coupled resonator 13, a single loop FW matching the impedance F is formed. The formation of the loop FW improves steepness at a low-pass end in the pass band.

Figure 11:
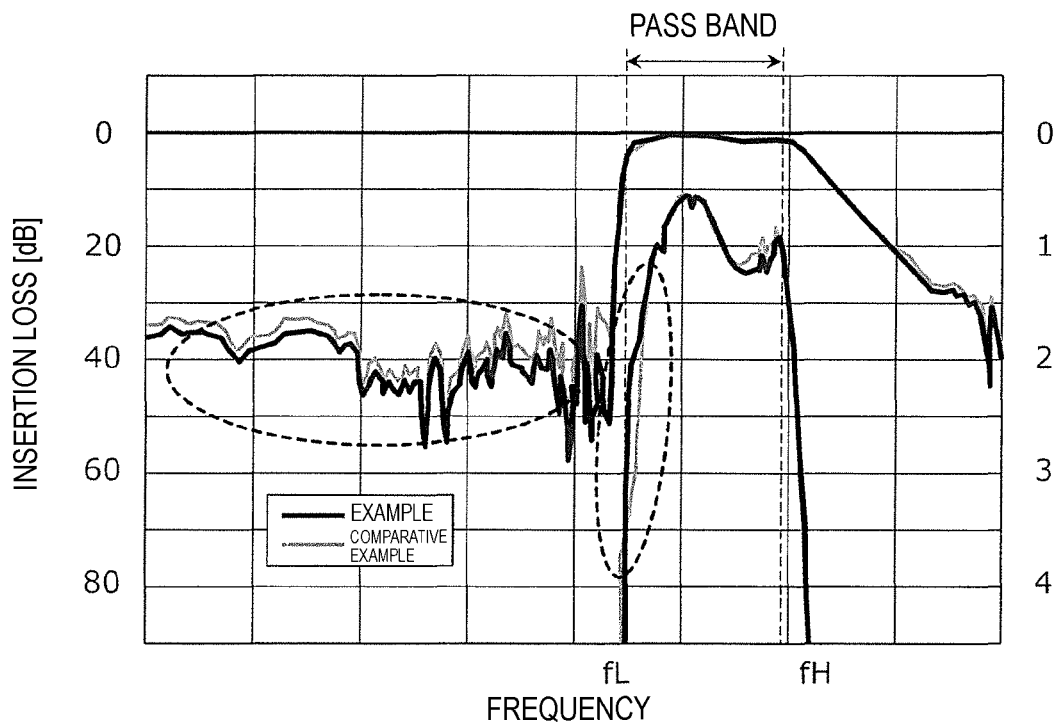
FIG. 11 is a graph showing an example of insertion loss of the filter according to the first embodiment.

FIG. 11 is a graph showing an example of insertion loss of the filter 18. In FIG. 11, an example shows insertion loss between the terminals 11 and 12 in FIG. 9, and a comparative example shows insertion loss between the point E and the terminal 12 in FIG. 9. Further, a frequency at a low-pass end of a pass band is denoted as fL, and a frequency at a high-pass end of the pass band is denoted as fH, and insertion loss in the pass band is enlarged and shown in accordance with a scale on a right side of the graph.

As seen in an elliptical enclosure on a left side of FIG. 11, attenuation on a lower frequency side is improved by the parallel resonator 14, better than in the pass band. Further, as seen in an elliptical enclosure in a central part, steepness at the low-pass end of the pass band is improved by the parallel resonator 14.

As described above, it was confirmed from FIG. 11 that by connecting the parallel resonator 14 to the resonator 132 in the filter 18, the effect of improving the characteristics was obtained. The effect described above is obtained by the filter 18 having the frequency band that is not limited, as the pass band.

Thus, also in the filter 10a in FIG. 1, since the parallel resonator 14 is connected to the resonator 132, among the resonator 132 and the resonators 131 and 133 forming the longitudinally coupled resonator 13, attenuation on a lower frequency side is improved better than in a pass band, and steepness at a low-pass end of the pass band is improved.

Second Embodiment

In a second embodiment, a multiplexer that includes a longitudinally coupled resonator, and adjusts a phase by a series inductor will be described, by illustrating an example of a multiplexer including two filters having respective pass bands different from each other. Hereinafter, description of the matters described in the first embodiment will be omitted as appropriate, and matters different from those in the first embodiment will be mainly described.

Figure 12:
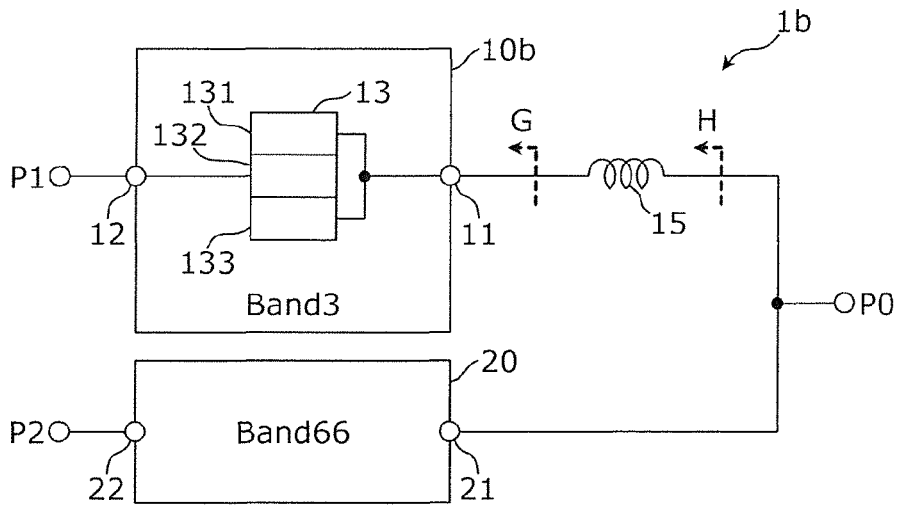
FIG. 12 is a circuit diagram illustrating an example of a configuration of a multiplexer according to a second embodiment.

FIG. 12 is a circuit diagram illustrating an example of a configuration of a multiplexer according to the second embodiment. As illustrated in FIG. 12, a multiplexer 1b is different from the multiplexer 1a in FIG. 1 in that the parallel resonator 14 is removed in a filter 10b, and the resonators 131 and 133 of the longitudinally coupled resonator 13 are connected to the terminal 11. Other than the difference in the filter 10b, the multiplexer 1b is the same as the multiplexer 1a.

Figure 13:
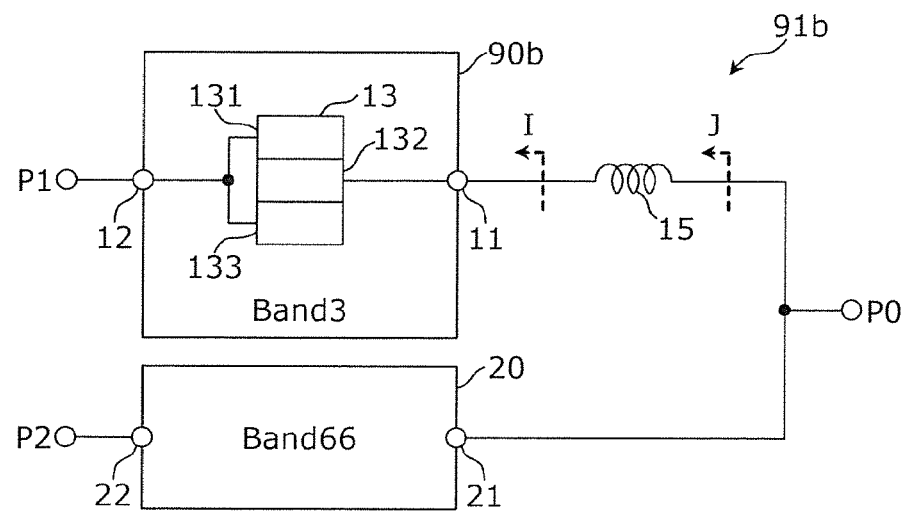
FIG. 13 is a circuit diagram illustrating an example of a configuration of a multiplexer according to a comparative example of the second embodiment.

FIG. 13 is a circuit diagram illustrating an example of a configuration of a multiplexer 91b according to a comparative example of the second embodiment. The multiplexer 91b is different from the multiplexer 1b in FIG. 12 in that the resonator 132 of the longitudinally coupled resonator 13 is connected to the terminal 11 in a filter 90b. Other than the difference in the filter 90b, the multiplexer 91b is the same as the multiplexer 1b.

Figure 14:
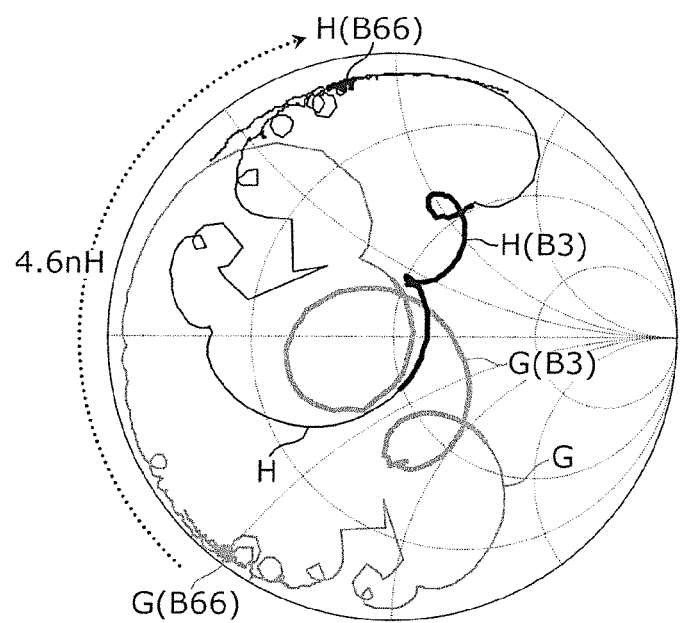
FIG. 14 is a Smith chart showing an example of impedance of a main part of the multiplexer according to the second embodiment.

FIG. 14 is a Smith chart showing an example of impedance of a main part of the multiplexer 1b. In FIG. 14, impedance G shown in gray is impedance when the filter 10b is viewed from a point G of the multiplexer 1b. Parts G(B3) and G(B66) of the impedance G, each indicated by a bold line indicate a part corresponding to a first frequency band (downlink frequency band in Band3) and a part corresponding to a second frequency band (frequency band in Band66) of the impedance G, respectively.

Additionally, impedance H indicated in black is impedance when the inductor 15 is viewed from a point H of the multiplexer 1b. Parts H(B3) and H(B66) of the impedance H, each indicated by a bold line indicate a part corresponding to a first frequency band (downlink frequency band in Band3) and a part corresponding to a second frequency band (frequency band in Band66) of the impedance H, respectively.

Figure 15:
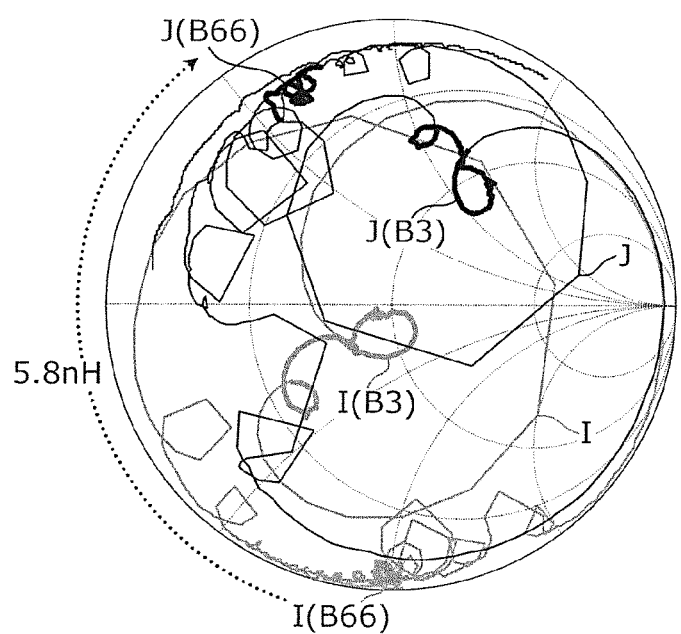
FIG. 15 is a Smith chart showing an example of impedance of a main part of the multiplexer according to the comparative example of the second embodiment.

FIG. 15 is a Smith chart showing an example of impedance of a main part of the multiplexer 91b. In FIG. 15 as well, according to notation similar to that in FIG. 14, impedance I when the filter 90b is viewed from a point I of the multiplexer 91b, and impedance J when the inductor 15 is viewed from a point J of the multiplexer 91b are shown.

In the multiplexer 1b, the impedances H is located at an inductive position, and in the multiplexer 91b, the impedance J is located at an inductive position. Accordingly, when the impedance H and capacitive impedance (not illustrated) of the filter 20 are combined, impedance of an entirety of the multiplexer 1b approaches, for example, reference impedance of about 50Ω, or the like, and when the impedance J and the capacitive impedance (not illustrated) of the filter 20 are combined, impedance of an entirety of the multiplexer 91b approaches, for example, the reference impedance of about 50Ω, or the like. Here, the reference impedance is impedance serving as a reference for a transmission system in which the multiplexer 1b or 91b is provided, and is not limited to about 50Ω, and may be about 75Ω, or the like.

As shown in FIG. 14, in the multiplexer 1b, the impedance G when the longitudinally coupled resonator 13 is viewed from the resonators 131 and 133 is rotated clockwise along a constant resistance circle on the Smith chart by the inductor 15, to be the impedance H. The part G(B66) corresponding to the second frequency band of the impedance G shifts to the part H(B66) of the impedance H. An inductance value of the inductor 15 for shifting the impedance G to the impedance H is about 4.6 nH, for example.

As shown in FIG. 15, in the multiplexer 91b as well, similar phase adjustment is performed. In the multiplexer 91b, an inductance value of the inductor 15 for shifting the impedance I to the impedance J is about 5.8 nH, for example.

From comparison of FIG. 14 with FIG. 15, it can be seen that, in an example, a smaller inductance value suffices for the inductor 15, compared to that in the comparative example.

Next, a description will be given of a reduction effect of insertion loss due to a small inductance value of the inductor 15.

Figure 16:
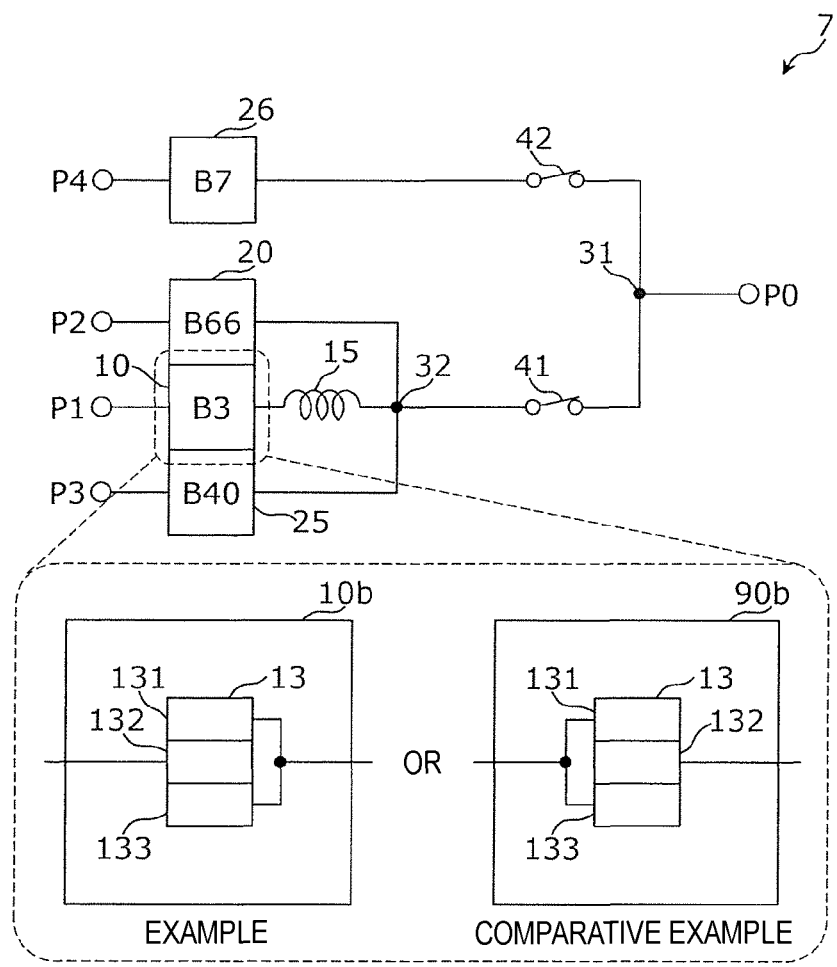
FIG. 16 is a circuit diagram illustrating an example of a configuration of a quadplexer according to the second embodiment.

FIG. 16 is a circuit diagram illustrating an example of a configuration of a quadplexer used to check a reduction effect of insertion loss. As illustrated in FIG. 16, the quadplexer 7 is the same as the quadplexer 7 in FIG. 7.

A case where the filter 10 of the quadplexer 7 is replaced with the filter 10b in FIG. 12 is taken as an example, and a case where the filter 10 is replaced with the filter 90b in FIG. 13 is taken as a comparative example, and comparison was performed for insertion loss between each of the individual terminals P1 to P4 and the common terminal P0 between the example and the comparative example.

Figure 17A:
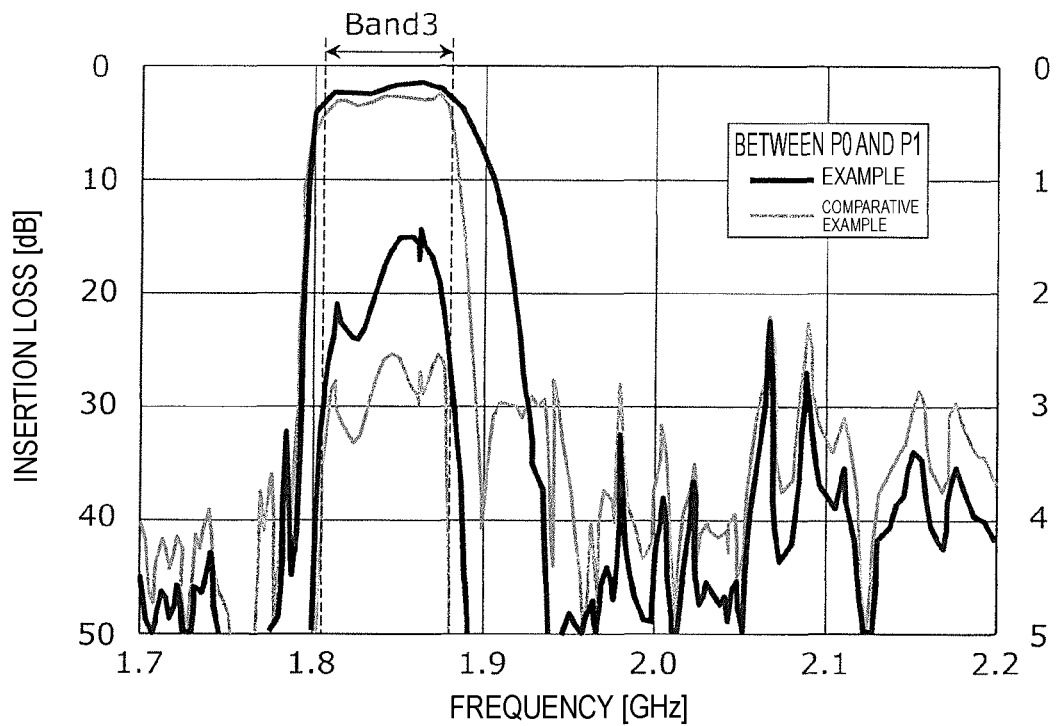
FIG. 17A is a graph showing an example of insertion loss of the quadplexer according to the second embodiment.
Figure 17B:
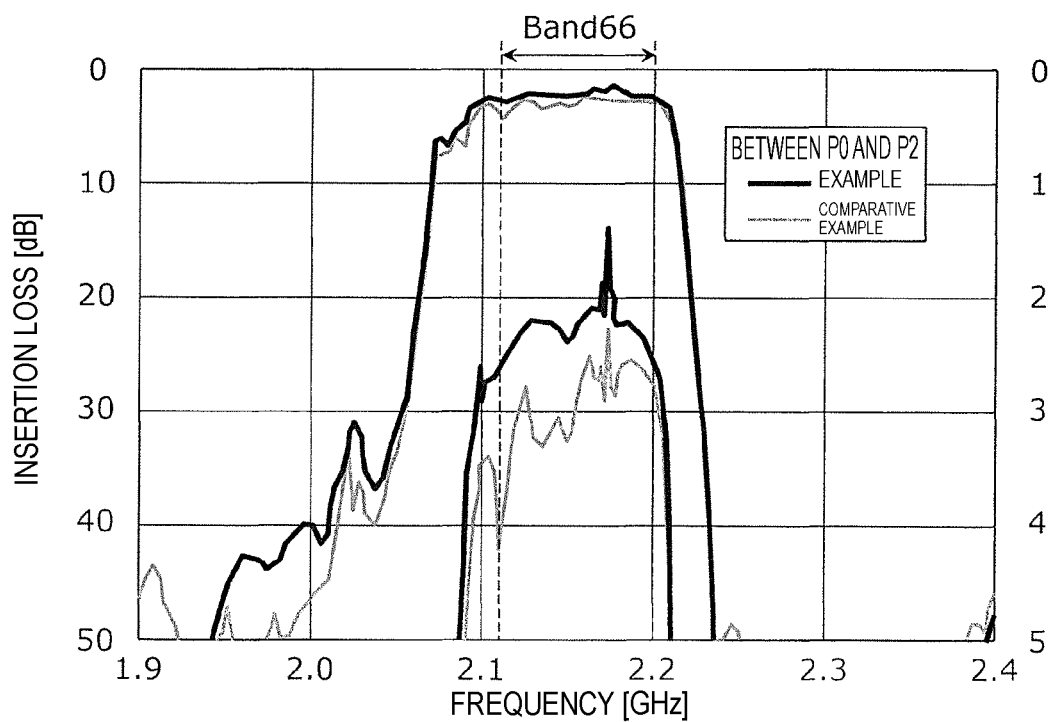
FIG. 17B is a graph showing an example of the insertion loss of the quadplexer according to the second embodiment.
Figure 17C:
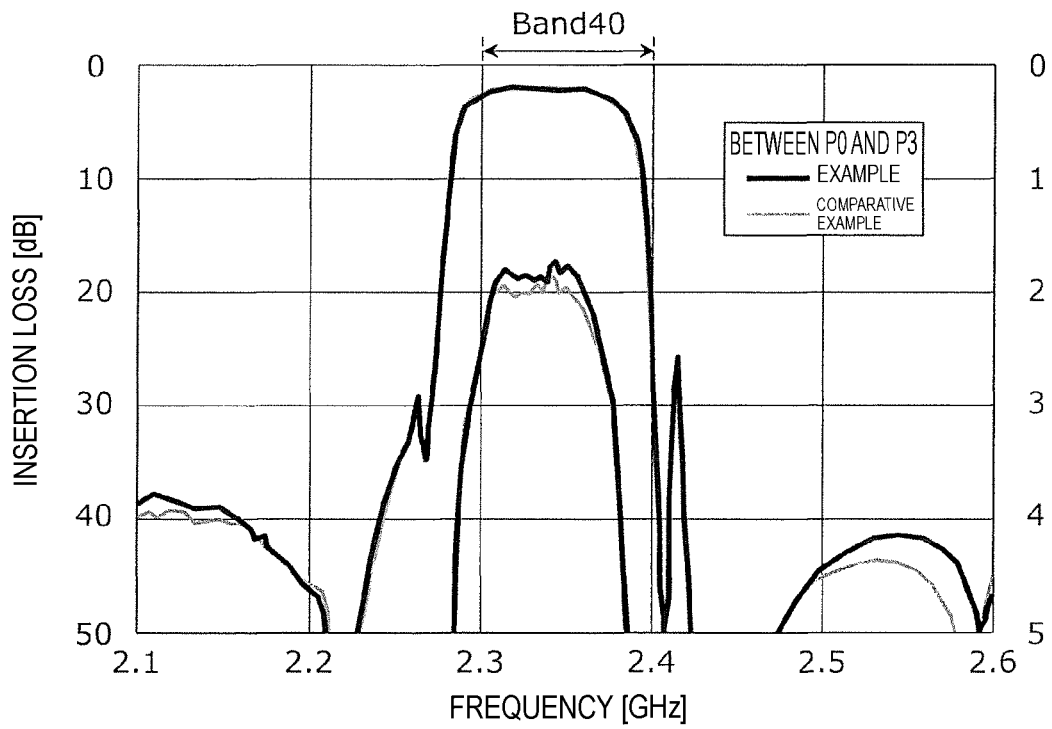
FIG. 17C is a graph showing an example of the insertion loss of the quadplexer according to the second embodiment.
Figure 17D:
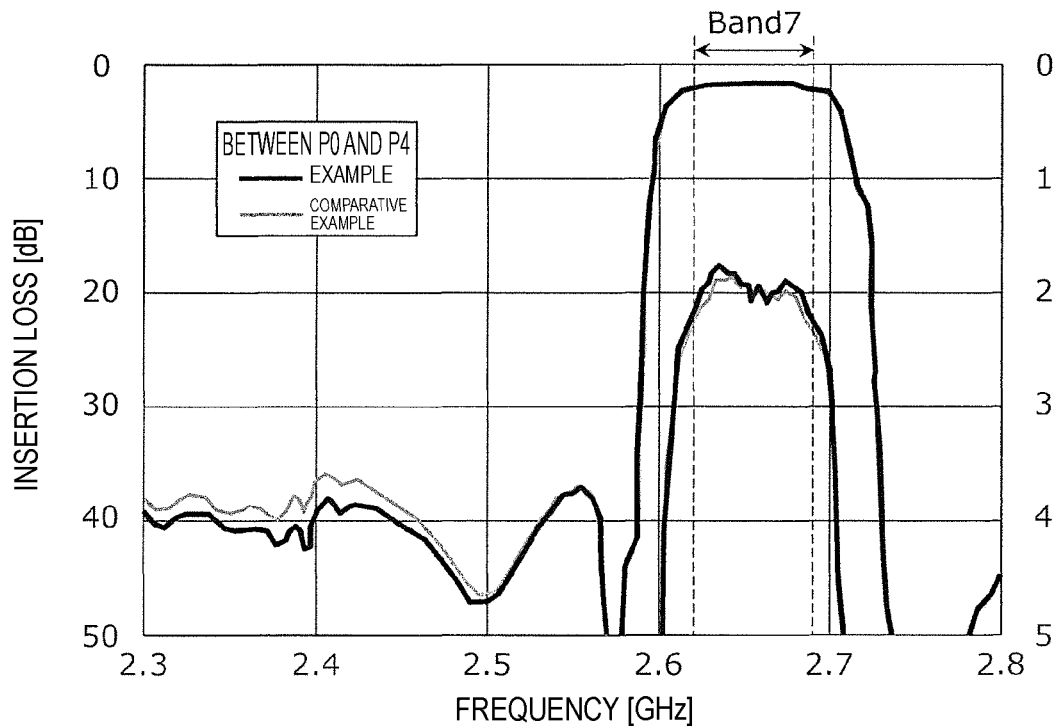
FIG. 17D is a graph showing an example of the insertion loss of the quadplexer according to the second embodiment.

FIG. 17A is a graph showing an example of insertion loss in a signal path between the individual terminal P1 of the quadplexer 7 and the common terminal P0, FIG. 17B is a graph showing an example of insertion loss in a signal path between the individual terminal P2 of the quadplexer 7 and the common terminal P0, FIG. 17C is a graph showing an example of insertion loss in a signal path between the individual terminals P3 of the quadplexer 7 and the common terminal P0, and FIG. 17D is a graph showing an example of insertion loss in a signal path between the individual terminals P4 of the quadplexer 7 and the common terminal P0. In each of FIG. 17A to FIG. 17D, insertion loss in a pass band is enlarged and shown in accordance with a scale on a right side of the graph.

From FIG. 17A, it can be seen that insertion loss in Band3 is smaller in the example than in the comparative example. This is considered to be due to a fact that, in the filter 10b, the inductance value of the inductor 15 decreases, compared to the filter 90b.

From FIG. 17B, it can be seen that insertion loss in Band66 is smaller in the example than in the comparative example. This is, as can be seen in FIG. 14 and FIG. 15, considered to be due to a fact that the part H(B66) of the impedance H is located closer to an open side and to an outer periphery, than a part J(B66) of the impedance J. That is, when the inductor 15 is viewed from the connection point 32, in the filter 10b, impedance is higher in Band66 than in the filter 90b, and thus it is considered that leakage of a signal in Band66 to the filter 10b is reduced.

From FIG. 17C and FIG. 17D, it can be seen that insertion loss does not increase in Band40 and Band7 in the example compared to the comparative example.

As described above, form FIG. 17A to FIG. 17D, it was confirmed that in the example using the filter 10b, an improvement effect of insertion loss was obtained, compared to the comparative example using the filter 90b.

Third Embodiment

In a third embodiment, a multiplexer including a capacitor will be described.

Figure 18:
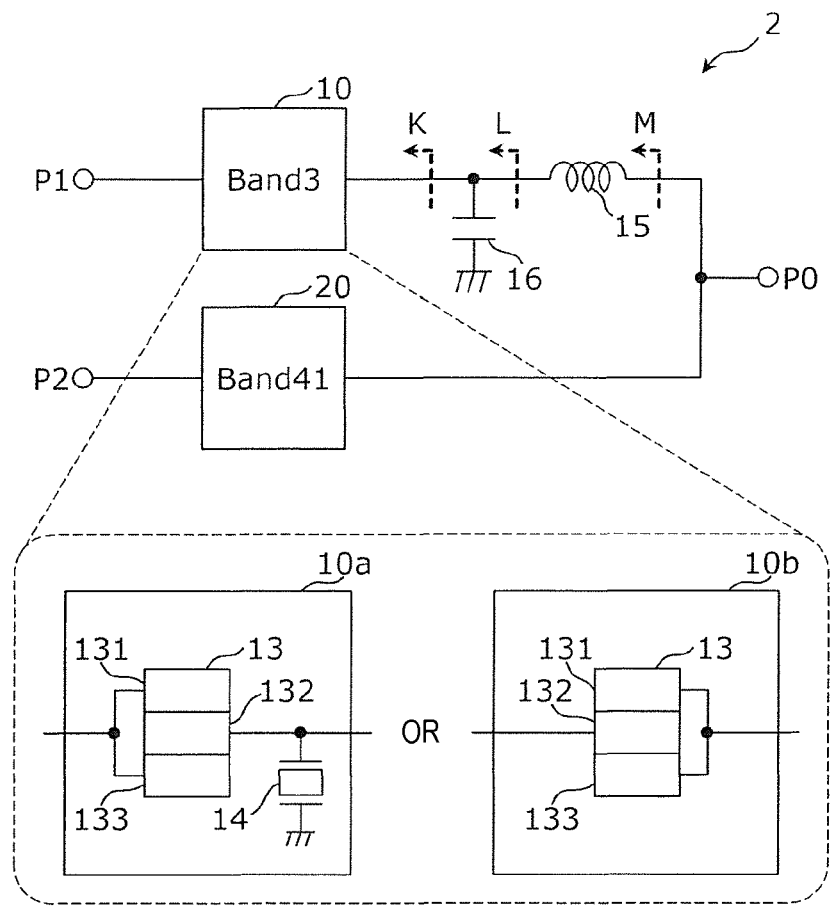
FIG. 18 is a circuit diagram showing an example of a configuration of a multiplexer according to a third embodiment.

FIG. 18 is a circuit diagram illustrating an example of a configuration of a multiplexer according to the third embodiment. The filter 10a or the filter 10b is used as the filter 10 of a multiplexer 2. As illustrated in FIG. 18, the multiplexer 2 differs from the multiplexer 1a in FIG. 1 or the multiplexer 1b in FIG. 12 in that a capacitor 16 is added.

Figure 19:
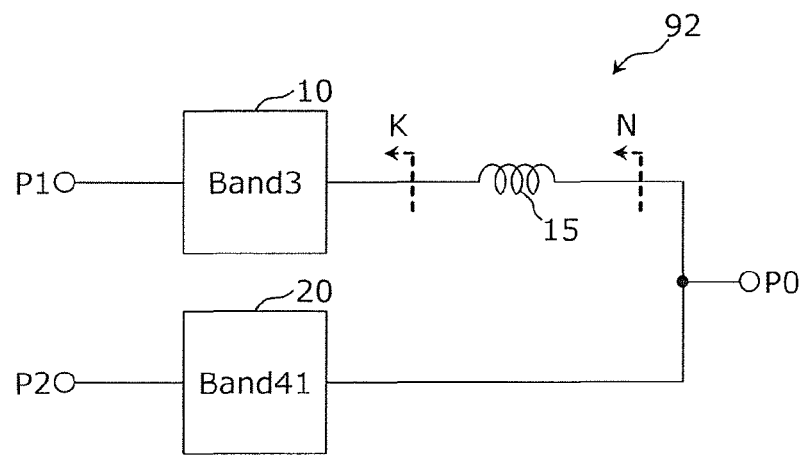
FIG. 19 is a circuit diagram illustrating an example of a configuration of a multiplexer according to a comparative example of the third embodiment.

FIG. 19 is a circuit diagram illustrating an example of a configuration of a multiplexer 92 according to a comparative example. The multiplexer 92 differs from the multiplexer 2 in FIG. 18 in that the capacitor 16 is not included.

Figure 20:
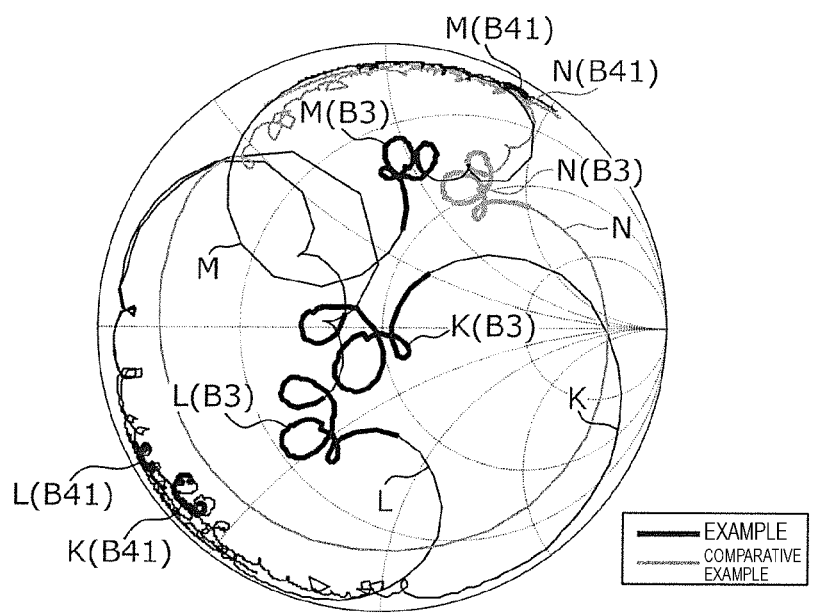
FIG. 20 is a Smith chart showing an example of impedance of a main part of a multiplexer according to an example and a main part of the multiplexer according to the comparative example of the third embodiment.

FIG. 20 is a Smith chart showing an example of impedance of a main part of the multiplexer 2, and impedance of a main part of the multiplexer 92. In FIG. 20, four examples of impedance K to impedance N are shown.

The impedance K is impedance when the filter 10 is viewed from a point K of each of the multiplexers 2 and 92.

The impedance L is impedance when the capacitor 16 is viewed from a point L of the multiplexer 2.

The impedance M is impedance when the inductor 15 is viewed from a point M of the multiplexer 2.

The impedance N is impedance when the inductor 15 is viewed from a point N of the multiplexer 92.

In each of the impedance K to impedance N, a part corresponding to a first frequency band (downlink frequency band in Band3) and a part corresponding to a second frequency band (frequency band in Band41) are each indicated by a bold line.

In the multiplexer 2, the impedances M is located at an inductive position, and in the multiplexer 92, the impedance N is located at an inductive position. Accordingly, when the impedance M and capacitive impedance (not illustrated) of the filter 20 are combined, impedance of an entirety of the multiplexer 2 approaches, for example, reference impedance of about 50Ω, or the like, and when the impedance N and the capacitive impedance (not illustrated) of the filter 20 are combined, impedance of an entirety of the multiplexer 92 approaches, for example, the reference impedance of about 50Ω, or the like. Here, the reference impedance is impedance serving as a reference for a transmission system in which the multiplexer 2 or 92 is provided, and is not limited to about 50Ω, and may be about 75Ω, or the like.

As seen in FIG. 20, in an example, a position of the impedance in the second frequency band of the filter 10 on the Smith chart is first moved from a position K(B41) to a position L(B41) on a short side by the capacitor 16. Then, the position is moved from the position L(B41) to a position M(B41) before the combination with the acoustic wave filter 20, by the inductor 15.

On the other hand, in a comparative example, a position of impedance in the second frequency band of the acoustic wave filter 10 on the Smith chart is moved, by the inductor 15, from the position K(B41) to a position N(B41) before the combination with the acoustic wave filter 20.

Assuming that the position N(B41) and the position M(B41) are substantially the same position, an amount of movement of the impedance by the inductor 15 in a case where the capacitor 16 is included is smaller than that in a case where the capacitor 16 is not included. That is, by providing the capacitor 16, impedance matching can be achieved with the inductor 15 having a smaller inductance value, and thus insertion loss is improved.

Further, the position L(B41) after being moved by the capacitor 16 is located closer to an outer periphery on the Smith chart, than the position K(B41) before the movement. Thus, return loss in the second frequency band of the acoustic wave filter 10 when viewed from the common terminal P0 is improved.

Figure 21:
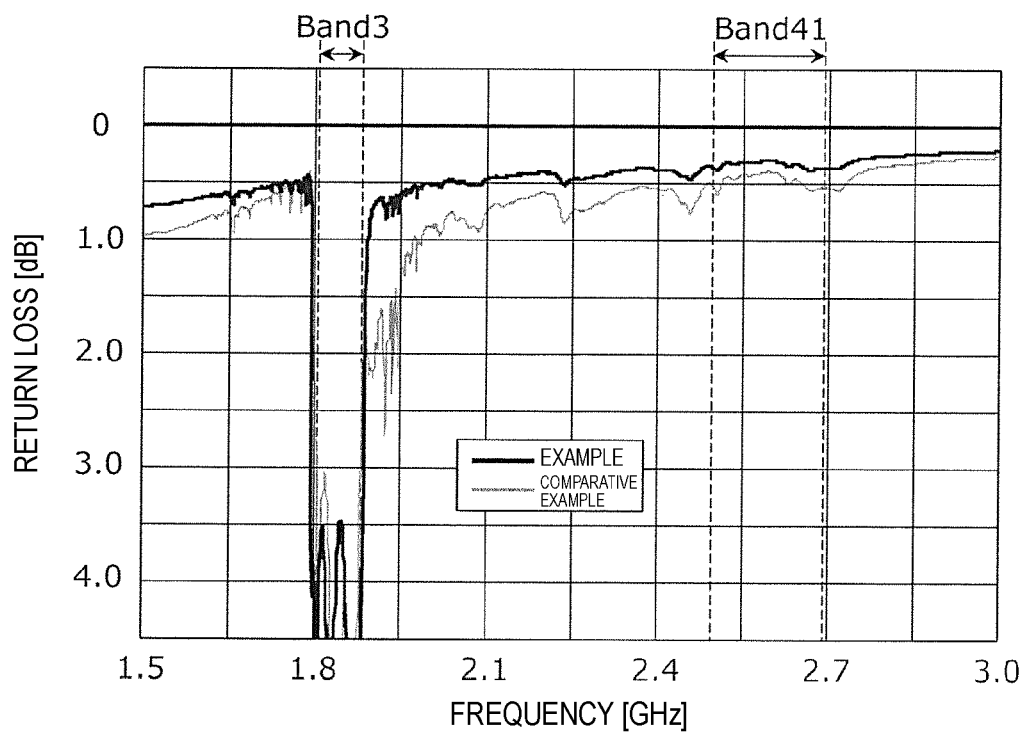
FIG. 21 is a graph showing an example of return loss of the respective multiplexers according to the example and the comparative example of the third embodiment.

FIG. 21 is a graph showing an example of the return loss of the filter 10 when viewed from the common terminal P0, in the multiplexer 2 (example) and the multiplexer 92 (comparative example). From the graph in FIG. 21, it can be seen that in the multiplexer 2, the return loss in the second frequency band is improved, compared to the multiplexer 92.

Further, the capacitor 16 suppresses outflow of an unnecessary wave generated by a high-order mode of the filter 10.

As described above, with the multiplexer 2 provided with the capacitor 16, a multiplexer having smaller loss is obtained, compared to the multiplexer 92 not including the capacitor 16.

Fourth Embodiment

In a fourth embodiment, a multiplexer in which the capacitor 16 is incorporated in the filter 10 will be described.

Figure 22:
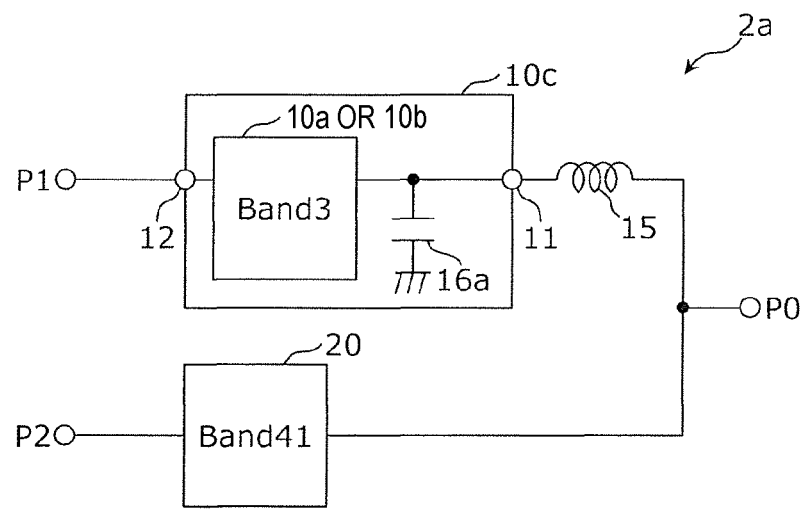
FIG. 22 is a circuit diagram illustrating an example of a configuration of a multiplexer according to a fourth embodiment.

FIG. 22 is a circuit diagram illustrating an example of a configuration of a multiplexer according to a fourth embodiment. As illustrated in FIG. 22, in a multiplexer 2a, a filter 10c is formed of a capacitor 16a, and the filter 10a or 10b. That is, the capacitor 16a is incorporated in the filter 10c.

Figure 23:
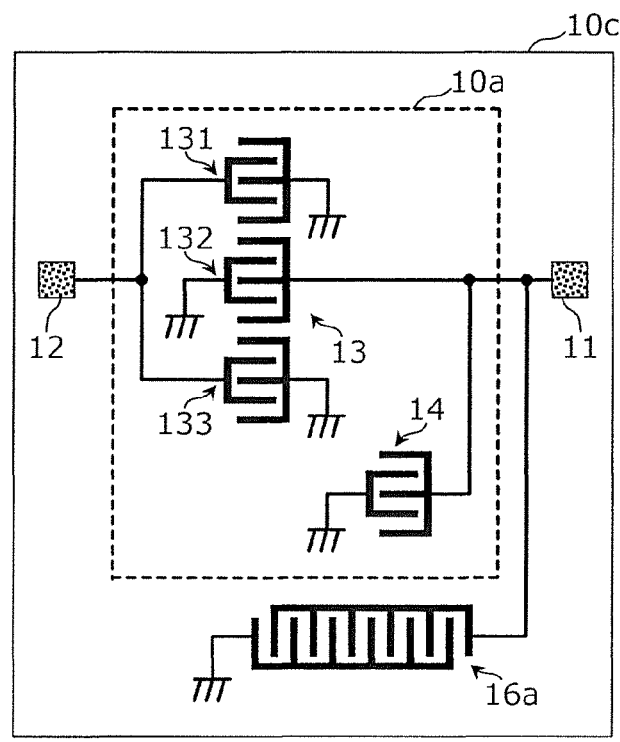
FIG. 23 is a plan view schematically illustrating an example of structure of a filter according to the fourth embodiment.

FIG. 23 is a plan view schematically illustrating an example of structure of the filter 10c. As illustrated in FIG. 23, when the filter 10c is formed of the capacitor 16a and the filter 10a, the capacitor 16a may be formed of an IDT electrode for which an orientation is changed by 90 degrees from that of an IDT electrode of a resonator included in the filter 10a. The resonator included in the filter 10a includes the resonators 131, 132, and 133 of the longitudinally coupled resonator 13, and the parallel resonator 14.

Similarly, when the filter 10c is formed of the capacitor 16a and the filter 10b, the capacitor 16a may be formed of an IDT electrode for which an orientation is changed by 90 degrees from that of an IDT electrode of a resonator included in the filter 10b (not illustrated).

Thereby, the capacitor 16a having no resonance and antiresonance is formed in a small space.

According to the acoustic wave filter 10a, since the number of components is reduced, it is possible to utilize a module space and reduce component costs.

Fifth Embodiment

In a fifth embodiment, a multiplexer in which the filter 20 and the common terminal P0 are connected to each other via a capacitor will be described.

Figure 24:
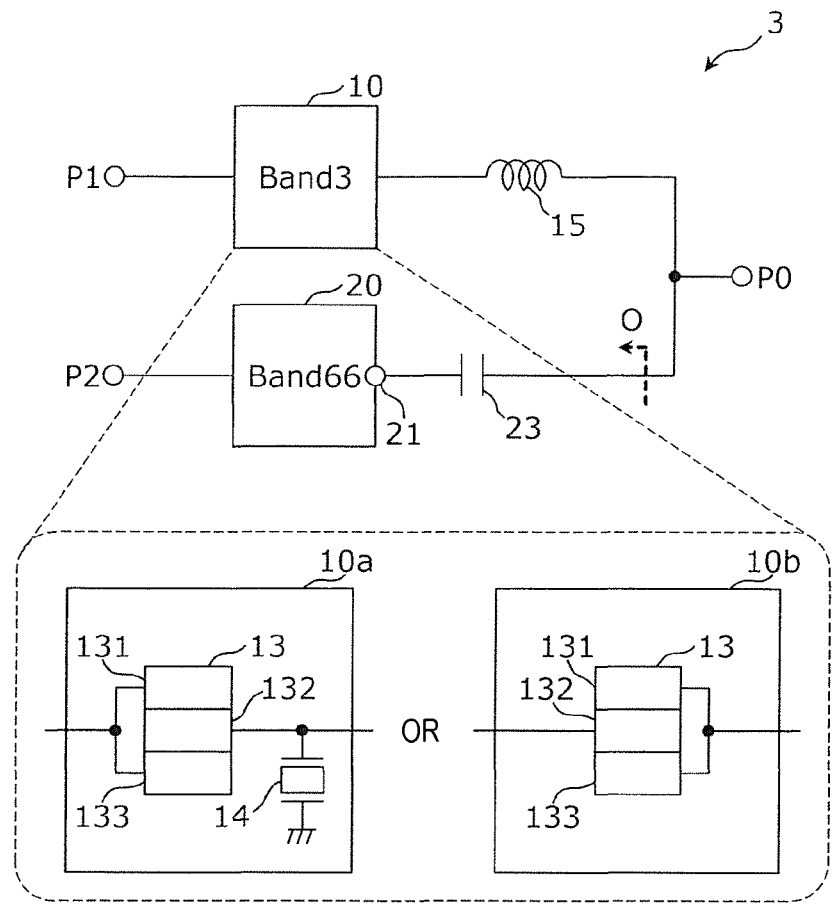
FIG. 24 is a circuit diagram illustrating an example of a configuration of a multiplexer according to a fifth embodiment.

FIG. 24 is a circuit diagram illustrating an example of a configuration of a multiplexer 3 according to the fifth embodiment. The filter 10a or the filter 10b is used as the filter 10 of the multiplexer 3. As illustrated in FIG. 24, the multiplexer 3 differs from the multiplexer 1a in FIG. 1 and the multiplexer 1b in FIG. 12 in that a capacitor 23 is added. In the multiplexer 3, the terminal 21 of the filter 20 is connected to the common terminal P0 via the capacitor 23.

Hereinafter, a characteristic configuration and effects of the multiplexer 3 as an example will be described, in comparison with a comparative example.

Figure 25:
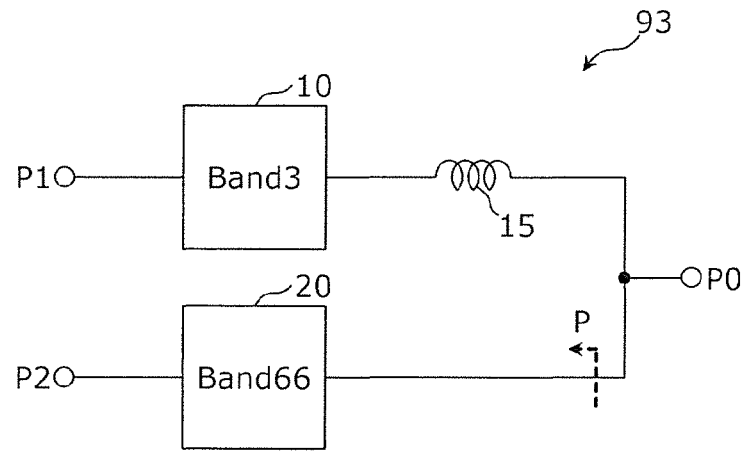
FIG. 25 is a circuit diagram illustrating an example of a configuration of a multiplexer according to a comparative example of the fifth embodiment.

FIG. 25 is a circuit diagram illustrating an example of a configuration of a multiplexer 93 according to a comparative example. The multiplexer 93 has the same configuration as that of the multiplexer 1a in FIG. 1 or the multiplexer 1b in FIG. 12.

Figure 26:
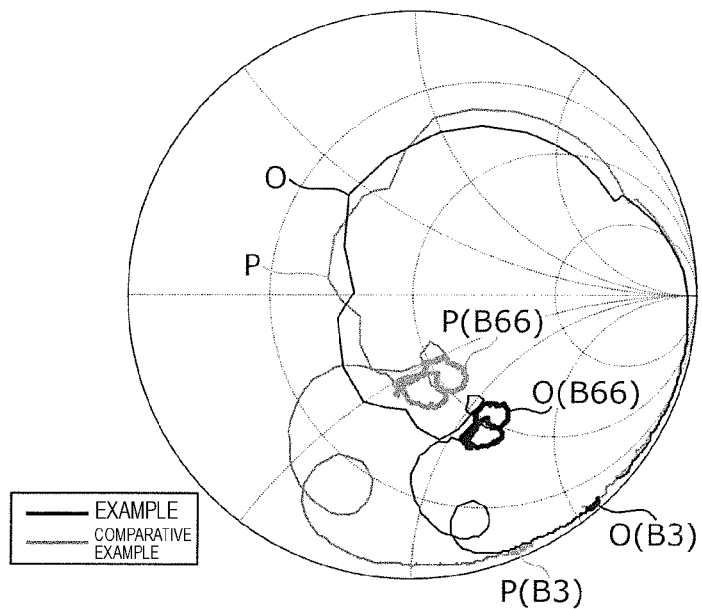
FIG. 26 is a Smith chart showing an example of impedance of a main part of a multiplexer according to an example and a main part of the multiplexer according to the comparative example of the fifth embodiment.

FIG. 26 is a Smith chart showing an example of impedance of a main part of the multiplexer 3, and impedance of a main part of the multiplexer 93. In FIG. 26, two examples of impedance O and impedance P are shown.

The impedance O is impedance when the capacitor 23 is viewed from a point O of the multiplexer 3.

The impedance P is impedance when the filter 20 is viewed from a point P of the multiplexer 93.

In each of the impedance O and impedance P, a part corresponding to a first frequency band (downlink frequency band in Band3) and a part corresponding to a second frequency band (frequency band in Band66) are each indicated by a bold line.

In the multiplexer 3, the impedances O is located at a capacitive position, and in the multiplexer 93, the impedance P is located at a capacitive position. Accordingly, when the impedance O, and impedance (not illustrated) of the filter 10 after adjusted by the inductor 15 to be inductive are combined, impedance of an entirety of the multiplexer 3 approaches, for example, reference impedance of about 50Ω, and when the impedance P, and the impedance (not illustrated) of the filter 10 after adjusted by the inductor 15 to be inductive are combined, impedance of an entirety of the multiplexer 93 approaches, for example, the reference impedance of about 50Ω. Here, the reference impedance is impedance serving as a reference for a transmission system in which the multiplexer 3 or 93 is provided, and is not limited to about 50Ω, and may be about 75Ω, or the like.

As seen in FIG. 26, impedance in the first frequency band of the filter 20 is at a position P(B3) on the Smith chart in the comparative example. On the other hand, in the example, the capacitor 23 moves the impedance from the position P(B3) in the comparative example to a position O(B3) on an open side.

As a result, in the example, insertion loss in the first frequency band of the multiplexer is further improved as compared with the comparative example.

Figure 27:
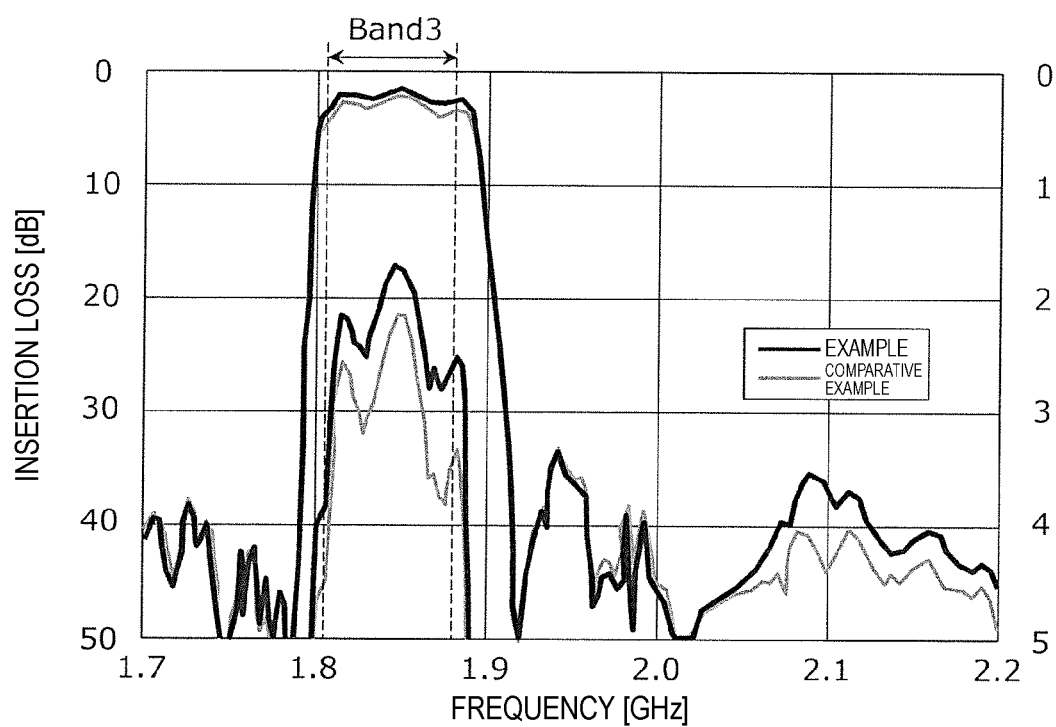
FIG. 27 is a graph showing an example of insertion loss of the respective multiplexers according to the example and the comparative example of the fifth embodiment.

FIG. 27 is a graph showing an example of insertion loss between the terminals P0 and P1 of each of the multiplexers 3 and 93.

Figure 28:
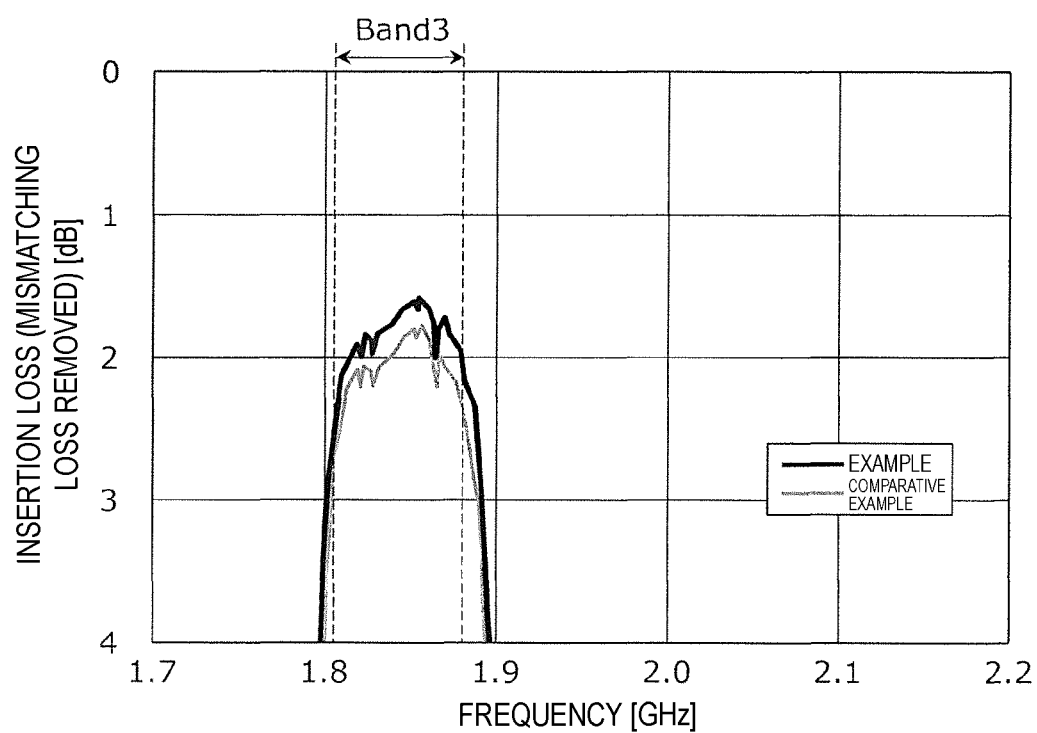
FIG. 28 is a graph showing an example of the insertion loss of the respective multiplexers according to the example and the comparative example of the fifth embodiment.

FIG. 28 is a graph showing an example of insertion loss when mismatching loss between the terminals P0 and P1 of each of the multiplexers 3 and 93 is removed.

From FIGS. 27 and 28, it can be seen that insertion loss in Band3 is smaller in the example than in the comparative example. This is, as can be seen in FIG. 26, considered to be due to a fact that the part O(B3) of the impedance O is located closer to an open side, than the part P(B3) of the impedance P. That is, in the multiplexer 3 in which the filter 20 is viewed from the common terminal P0 via the capacitor 23, since impedance in Band3 is higher, compared to the multiplexer 93 in which the filter 20 is directly viewed from the common terminal P0, it is considered that leakage of a signal in Band3 to the filter 10 is reduced.

As described above, from FIGS. 27 and 28, it was confirmed that, in the example using the multiplexer 3, the insertion loss is smaller than that in the comparative example using the multiplexer 93.

Sixth Embodiment

In a sixth embodiment, a high-frequency front-end circuit including the multiplexer 1a described in the first embodiment, and a communication device including the high-frequency front-end circuit will be described.

Figure 29:
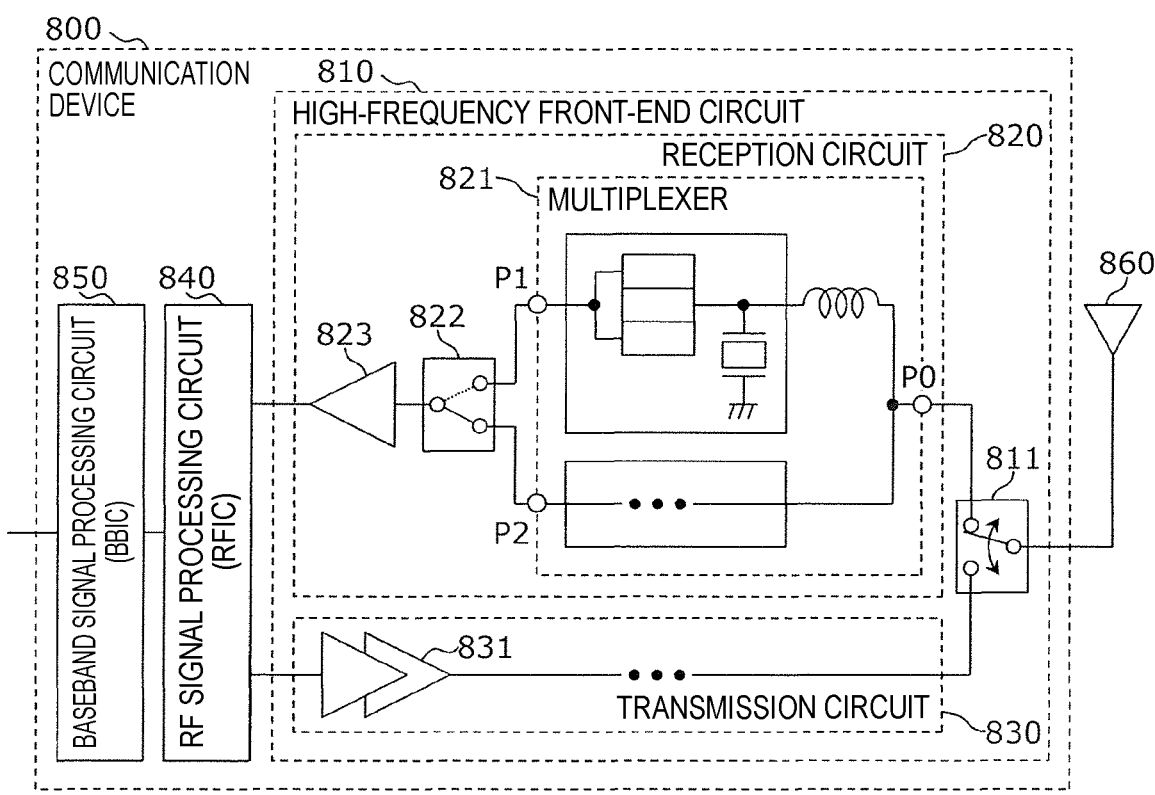
FIG. 29 is a block diagram illustrating an example of a functional configuration of a communication device according to a sixth embodiment.

FIG. 29 is a configuration diagram of a communication device 800 according to the sixth embodiment. The communication device 800 includes a high-frequency front-end circuit 810, an RF signal processing circuit 840, and a baseband signal processing circuit 850. Note that, in FIG. 29, an antenna 860 connected to the communication device 800 is also illustrated.

The high-frequency front-end circuit 810 includes a switch 811, a reception circuit 820, and a transmission circuit 830.

The reception circuit 820 includes a multiplexer 821, a switch 822, and a low-noise amplifier 823.

The multiplexer 821 is, for example, the multiplexer 1a according to the first embodiment.

The switch 822, in accordance with a control signal (not illustrated), selectively connects any one of the individual terminals P1 and P2 of the multiplexer 821 to an input terminal of the low-noise amplifier 823. The switch 822 may simultaneously connect both of the individual terminals P1 and P2 of the multiplexer 821 to the input terminal of the low-noise amplifier 823. Accordingly, the high-frequency front-end circuit 810 can support carrier aggregation.

The low-noise amplifier 823 amplifies a high-frequency signal (here, a high-frequency reception signal) supplied from the antenna 860 via the switch 811, the multiplexer 821, and the switch 822, and outputs the amplified high-frequency signal to the RF signal processing circuit 840.

The transmission circuit 830 includes a power amplifier 831.

The power amplifier 831 amplifies a high-frequency signal (here, a high-frequency transmission signal) supplied from the RF signal processing circuit 840, and outputs the amplified high-frequency signal to the antenna 860 via the switch 811.

A multiplexer similar to that of the reception circuit 820 may be provided also in the transmission circuit 830 (not illustrated).

Note that, the high-frequency front-end circuit 810 may include another circuit element between the constituent elements described above.

The RF signal processing circuit 840 converts a high-frequency reception signal supplied from the high-frequency front-end circuit 810 into a reception signal, and supplies the reception signal to the baseband signal processing circuit 850. The conversion may include demodulation and down-conversion of a signal. The RF signal processing circuit 840 also converts a transmission signal generated by the baseband signal processing circuit 850 into a transmission RF signal, and supplies the transmission RF signal to the high-frequency front-end circuit 810. The conversion may include modulation and up-conversion of a signal. The RF signal processing circuit 840 may be formed of a high-frequency integrated circuit (RFIC) chip.

The baseband signal processing circuit 850 converts transmission data generated by application devices/application software (not illustrated) for performing voice call, image display, and the like into a transmission signal, and supplies the transmission signal to the RF signal processing circuit 840. The conversion may also include data compression, multiplexing, and addition of an error correction code. Further, a reception signal received from the RF signal processing circuit 840 is converted into reception data, and the reception data is supplied to the application devices/application software. The conversion may include data decompression, demultiplexing, and error correction. The baseband signal processing circuit 850 may also be formed of a baseband integrated circuit (BBIC) chip.

According to the high-frequency front-end circuit 810 and the communication device 800 configured as described above, the multiplexer 1a according to the first embodiment described above is provided, and thus it is possible to obtain the high-frequency front-end circuit 810 and the communication device 800 for which insertion loss is small.

Note that, in the multiplexer 821 of the high-frequency front-end circuit 810, any one multiplexer among the multiplexers 1b, 7, 2, 2a, and 3 described in the second to fifth embodiments may be used, instead of the multiplexer 1a according to the first embodiment.

In addition, the communication device 800 may not include the baseband signal processing circuit 850, depending on a processing scheme of a high-frequency signal.

Other Modification Examples, and the Like

The multiplexers 1a, 1b, 7, 2, 2a, and 3 according to the first to fifth embodiments, and the high-frequency front-end circuit 810 and the communication device 800 according to the sixth embodiment have been described above, but the present disclosure is not limited to the embodiments described above. For example, an aspect in which the following modification is applied to the embodiment described above may also be included in the present disclosure.

For example, in the first to fifth embodiments, the description has been given by illustrating the longitudinally coupled resonator having three IDT electrodes formed of one first resonator, and two second resonators disposed on both sides thereof, but the longitudinally coupled resonator is not limited to have the three IDT electrodes. The longitudinally coupled resonator may have a configuration in which, for example, multiple longitudinally coupled resonators each having the three IDT electrodes are arranged and disposed, and are connected in parallel to each other, so that a second resonator located between first resonators is commonalized.

Specifically, the longitudinally coupled resonator may have five IDT electrodes formed of two first resonators and three second resonators disposed on both sides of each of the two first resonators. In addition, seven IDT electrodes including three first resonators, and four second resonators disposed on both sides of each of the three first resonators may be adopted. In addition, nine IDT electrodes including four first resonators, and five second resonators disposed on both sides of each of the four first resonators may be adopted.

The multiplexer according to the embodiments of the present disclosure is not limited to the configuration including only the plurality of reception filters, and may be configured to include only a plurality of transmission filters, or both a reception filter and a transmission filter.

According to the multiplexer, the high-frequency front-end circuit, and the communication device according to the embodiments of the present disclosure, it is possible to obtain a multiplexer, a high-frequency front-end circuit, and a communication device for which insertion loss is small.

The present disclosure is widely applicable to a communication device, such as a mobile phone, as a multiplexer, a high-frequency front-end circuit, a communication device, or the like with low-loss that can adapt to frequency standards supporting multi-band and multi-mode.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A multiplexer, comprising:
   a first filter having a first pass band, and a second filter having a second pass band, the second pass band being different than the first pass band;
   a common terminal to which a first terminal of the first filter and a second terminal of the second filter are connected; and
   an inductor having a first end that is connected to the first terminal and a second end that is connected to the common terminal, wherein:
   the first filter comprises:
      a longitudinally coupled resonator circuit comprising one or more first resonators and a plurality of second resonators, each side of each of the one or more first resonators being connected to one of the plurality of second resonators, and the one or more first resonators being connected to the first terminal, and
      a third resonator having a first end that is connected to the one or more first resonators and a second end that is connected to a ground electrode, and
   the one or more first resonators and the third resonator are connected to a signal path between the longitudinally coupled resonator circuit and the first terminal.

2. The multiplexer according to claim 1, wherein an anti-resonant frequency of the third resonator is within the first pass band of the first filter.

3. A multiplexer, comprising:
   a first filter having a first pass band and a second filter having a second pass band, the second pass band being different than the first pass band;
   a common terminal to which a first terminal of the first filter and a second terminal of the second filter are connected; and
   an inductor having a first end that is connected to the first terminal and a second end that is connected to the common terminal, wherein:
   the first filter comprises:
      a longitudinally coupled resonator circuit comprising of one or more first resonators and a plurality of second resonators, each side of each of the one or more first resonators being connected to one of the plurality of second resonators, and the plurality of second resonators being connected to the first terminal, and
   the plurality of second resonators are connected to a signal path between the longitudinally coupled resonator and the first terminal.

4. The multiplexer according to claim 1, further comprising:
   a first capacitor having a first end that is connected to a signal path between the longitudinally coupled resonator circuit and the inductor, and a second end that is connected to the ground electrode.

5. The multiplexer according to claim 3, further comprising:
   a first capacitor having a first end that is connected to a signal path between the longitudinally coupled resonator circuit and the inductor, and a second end that is connected to the ground electrode.

6. The multiplexer according to claim 4, wherein the first capacitor is incorporated in the first filter.

7. The multiplexer according to claim 5, wherein the first capacitor is incorporated in the first filter.

8. The multiplexer according to claim 1, further comprising:
    a second capacitor having a first end that is connected to the second terminal, and a second end that is connected to the common terminal.

9. The multiplexer according to claim 3, further comprising:
    a second capacitor having a first end that is connected to the second terminal, and a second end that is connected to the common terminal.

10. The multiplexer according to claim 1, wherein:
    the first filter is on a piezoelectric substrate, and
    the piezoelectric substrate comprises:
        a piezoelectric film on a first surface of the piezoelectric substrate, the first surface comprising an interdigital transducer (IDT) electrode thereon,
        a high acoustic velocity support substrate configured to propagate a bulk wave at a greater acoustic velocity than the piezoelectric film, and
        a low acoustic velocity film between the high acoustic velocity support substrate and the piezoelectric film, the low acoustic velocity film being configured to propagate a bulk wave at a lower acoustic velocity than the piezoelectric film.

11. The multiplexer according to claim 3, wherein:
    the first filter is on a piezoelectric substrate, and
    the piezoelectric substrate comprises:
        a piezoelectric film on a first surface, the first surface comprising an interdigital transducer (IDT) electrode thereon,
        a high acoustic velocity support substrate configured to propagate a bulk wave at a greater acoustic velocity than the piezoelectric film, and
        a low acoustic velocity film between the high acoustic velocity support substrate and the piezoelectric film, the low acoustic velocity film being configured to propagate a bulk wave at a lower acoustic velocity than the piezoelectric film.

12. The multiplexer according to claim 1, wherein the first filter comprises:
    a piezoelectric single crystal substrate of lithium niobate ($LiNbO_3$),
    an interdigital transducer (IDT) electrode on the piezoelectric single crystal substrate, and
    a dielectric film on the piezoelectric single crystal substrate and the IDT electrode.

13. The multiplexer according to claim 3, wherein the first filter comprises:
    a piezoelectric single crystal substrate of lithium niobate ($LiNbO_3$),
    an interdigital transducer (IDT) electrode on the piezoelectric single crystal substrate, and
    a dielectric film on the piezoelectric single crystal substrate and the IDT electrode.

14. A high-frequency front-end circuit, comprising:
    the multiplexer according to claim 1; and
    an amplifier circuit connected to the multiplexer.

15. A high-frequency front-end circuit, comprising:
    the multiplexer according to claim 3; and
    an amplifier circuit connected to the multiplexer.

16. A communication device, comprising:
    a radio frequency (RF) signal processing circuit configured to process a high-frequency signal transmitted and received by an antenna; and
    the high-frequency front-end circuit according to claim 14 configured to transmit the high-frequency signal between the antenna and the RF signal processing circuit.

17. A communication device, comprising:
    a radio frequency (RF) signal processing circuit configured to process a high-frequency signal transmitted and received by an antenna; and
    the high-frequency front-end circuit according to claim 15 configured to transmit the high-frequency signal between the antenna and the RF signal processing circuit.

* * * * *